United States Patent
Kayahan et al.

(10) Patent No.: US 11,764,824 B2
(45) Date of Patent: Sep. 19, 2023

(54) HIGH-LINEARITY RADIO FREQUENCY (RF) SWITCHES AND AMPLIFIERS

(71) Applicant: Analog Devices International Unlimited Company, Limerick (IE)

(72) Inventors: Huseyin Kayahan, Istanbul (TR); Berktug Ustundag, Istanbul (TR); Alp Oguz, Beyoglu (TR); Turusan Kolcuoglu, Sariyer (TR); Yusuf Atesal, Istanbul (TR)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/518,845

(22) Filed: Nov. 4, 2021

(65) Prior Publication Data
US 2023/0139103 A1    May 4, 2023

(51) Int. Cl.
*H04B 1/48* (2006.01)
*H04B 17/14* (2015.01)
*H03K 17/687* (2006.01)

(52) U.S. Cl.
CPC .......... *H04B 1/48* (2013.01); *H03K 17/6871* (2013.01); *H04B 17/14* (2015.01)

(58) Field of Classification Search
None
See application file for complete search history.

(56) References Cited

U.S. PATENT DOCUMENTS

| | | | |
|---|---|---|---|
| 7,026,858 B2 * | 4/2006 | Tosaka | H03K 17/693 327/427 |
| 8,081,928 B2 | 12/2011 | Kelly | |
| 8,320,843 B2 | 11/2012 | Seshita et al. | |
| 9,209,784 B2 * | 12/2015 | Iversen | H03K 17/102 |
| 10,469,121 B2 * | 11/2019 | Hurwitz | H04B 1/44 |
| 10,903,821 B1 * | 1/2021 | Guo | H03K 3/012 |
| 2014/0062577 A1 * | 3/2014 | Chih-Sheng | H03K 17/693 327/427 |

* cited by examiner

*Primary Examiner* — Kenneth B Wells
(74) *Attorney, Agent, or Firm* — Schwegman Lundberg & Woessner, P.A.

(57) ABSTRACT

System and methods for reducing nonlinearity in radio frequency (RF) circuitries (e.g., RF switch circuitry and/or RF amplifier circuitry) are provided. A high-linearity RF integrated circuit device includes an input port; an output port; nonlinear circuitry arranged on a signal path between the input port and the output port; a shunt path including signal adjustment circuitry; and adjustable nonlinearity generation circuitry coupled to the signal adjustment circuitry, the adjustable nonlinearity generation circuitry including one or more metal-oxide-semiconductor (MOS) devices; and at least one nonlinearity generation activation element connected in parallel with a source terminal and a drain terminal of a first MOS device of the one or more MOS devices and responsive to an activation control signal. The nonlinear circuitry may include at least one of switching circuitry or amplifier circuitry. The shunt path may be coupled to the input port or the output port.

20 Claims, 13 Drawing Sheets

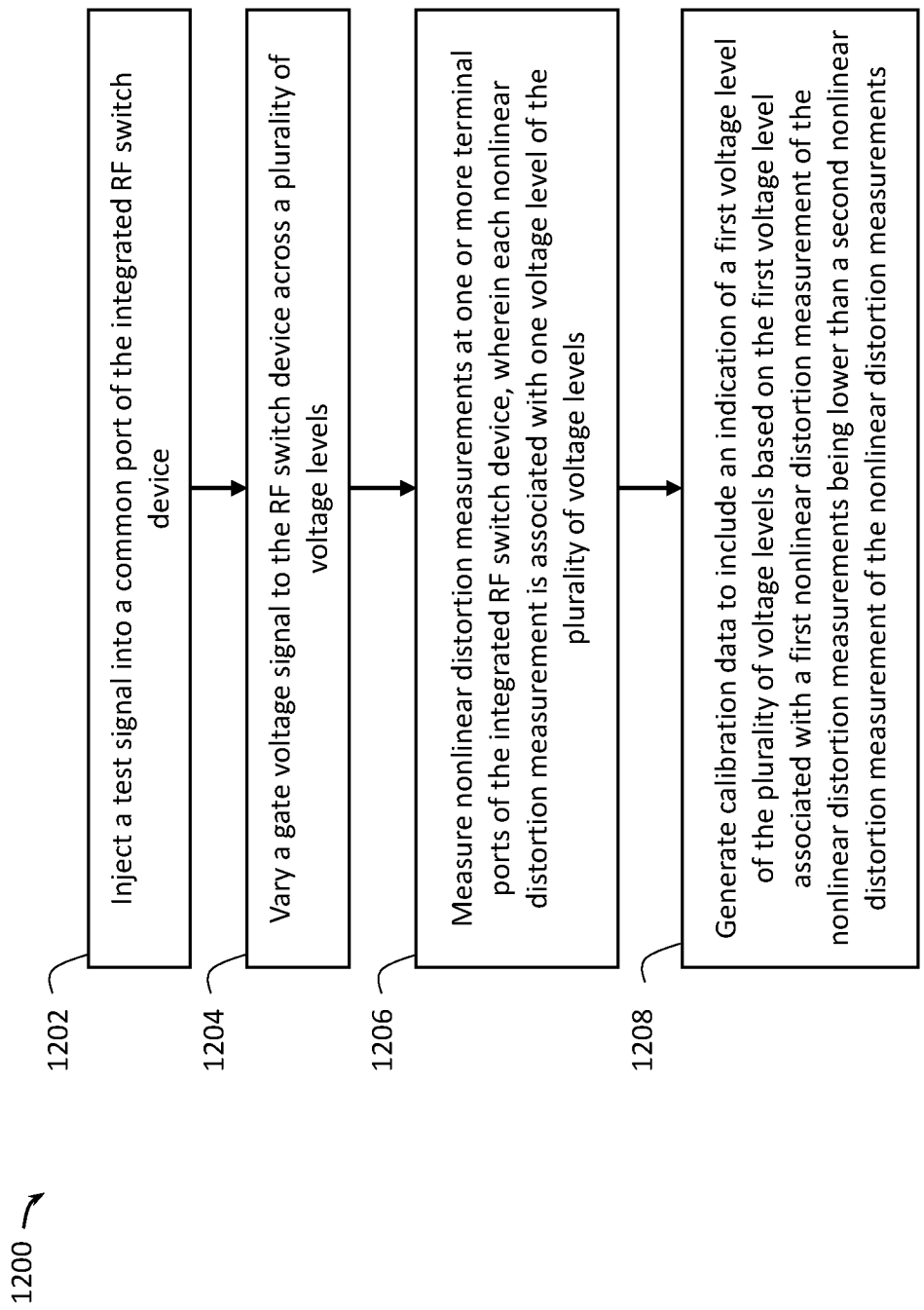

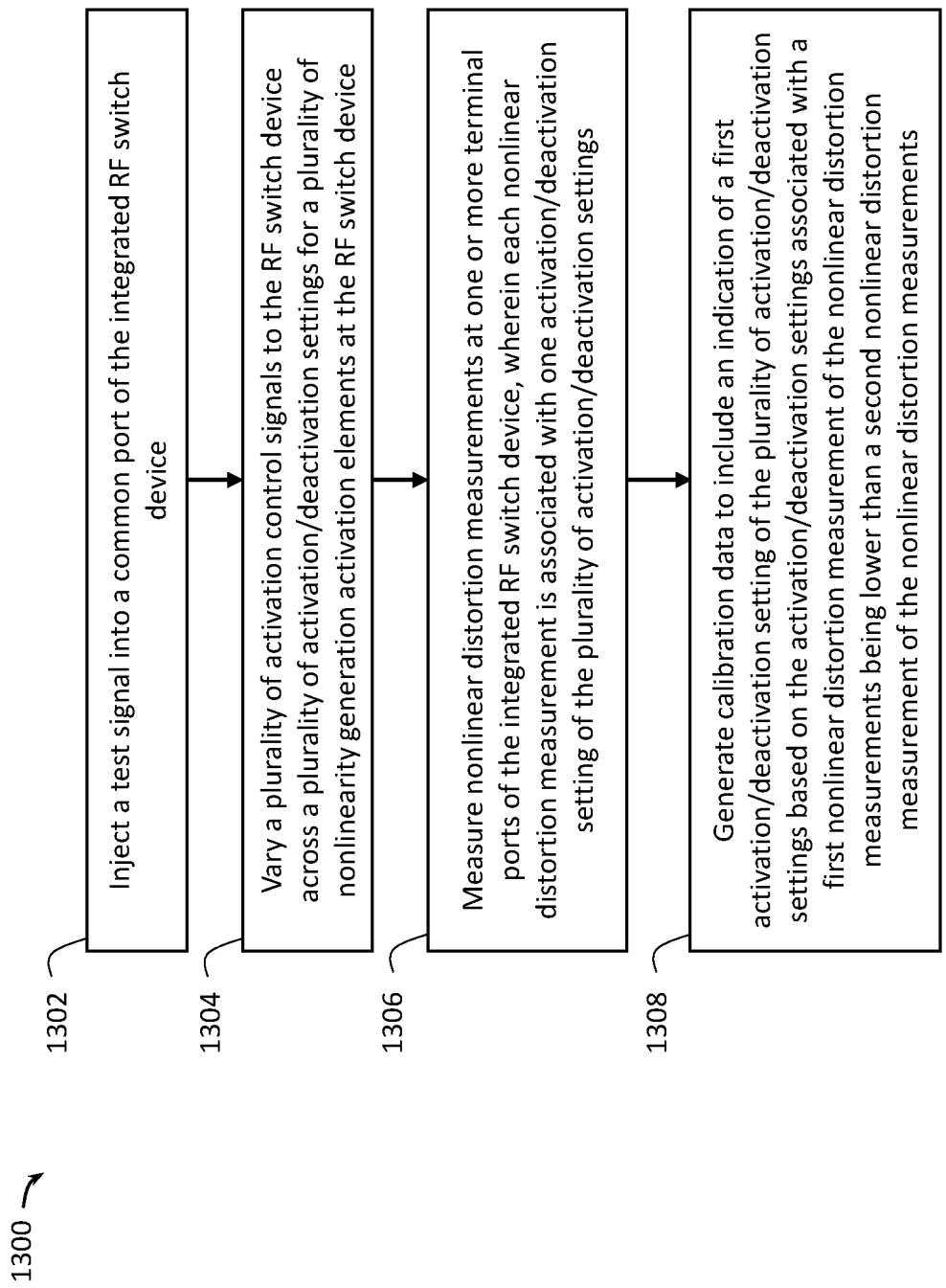

HIGH-LINEARITY RADIO FREQUENCY (RF) SWITCHES AND AMPLIFIERS

TECHNICAL FIELD OF THE DISCLOSURE

The present disclosure generally relates to electronics, and, more specifically, to reducing nonlinearity (e.g., due to intermodulation) in radio frequency (RF) circuitry (e.g., RF switches and RF amplifiers).

BACKGROUND

Radio systems are systems that transmit and receive signals in the form of electromagnetic waves in the RF range of approximately 3 kilohertz (kHz) to 300 gigahertz (GHz). Radio systems are commonly used for wireless communications, with cellular/wireless mobile technology being a prominent example, but may also be used for cable communications such as cable television. In both of these types of systems, linearity of various components therein plays a crucial role.

RF switches are commonly used in radio transceivers and wireless communication systems to route RF signals through transmission paths. In one example, an RF system, such as a mobile device or a base station, may include an antenna switch module implemented using RF switches. The antenna switch module can be used to electrically connect an antenna to a particular transmit or receive chain of the system, thereby allowing multiple components to access the antenna. In another example, an RF system may include multimode RF front end modules with multiple RF chains (e.g., with power amplifiers, filters, mixers, etc.) and may include RF switches to connect a transmit chain or a receive chain to a particular RF chain. In general, RF switches may be used to selectively route signals among RF components and/or RF subsystems.

The performance and/or operations of an RF switch may be specified by parameters such as insertion loss, isolation, switching speed, and/or linearity. Because RF switches are commonly coupled to antennas, transmitter chains, and/or receiver chains, linearity may be an important performance measure. Linearity generally refers to the ability of a component or a system to provide an output signal that is directly proportional to an input signal. In other words, if a component or a system is perfectly linear, the relationship of a ratio of the output signal to the input signal is a straight line. Examples of linearity performance parameters for an RF switch may include a 1-dB compression point (P1 dB) and a third-order intercept (IP3). P1 dB is the RF input power level at which the insertion loss of the RF switch increases by 1 dB over its lowest value. IP3 is a hypothetical point at which the power of third order components is at the same level as the power of the fundamental frequency component. The third order components may be generated as a byproduct due to inherent nonlinearity at the RF switch, and may be referred to as the third-order intermodulation distortion (IMD3). Because the power of the third order components can grow at three times the rate of the fundamental frequency component's power, IMD3 can degrade performance. In general, the better the linearity of the RF switch, the higher the and the lower the IMD3.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 12 is a flow diagram illustrating an exemplary method for calibrating a high-linearity integrated RF switch device, according to some embodiments of the present disclosure; and FIG. 13 is a flow diagram illustrating an exemplary method for calibrating a high-linearity integrated RF switch device, according to some embodiments of the present disclosure.

DESCRIPTION OF EXAMPLE EMBODIMENTS OF THE DISCLOSURE

Overview

Figure 1:
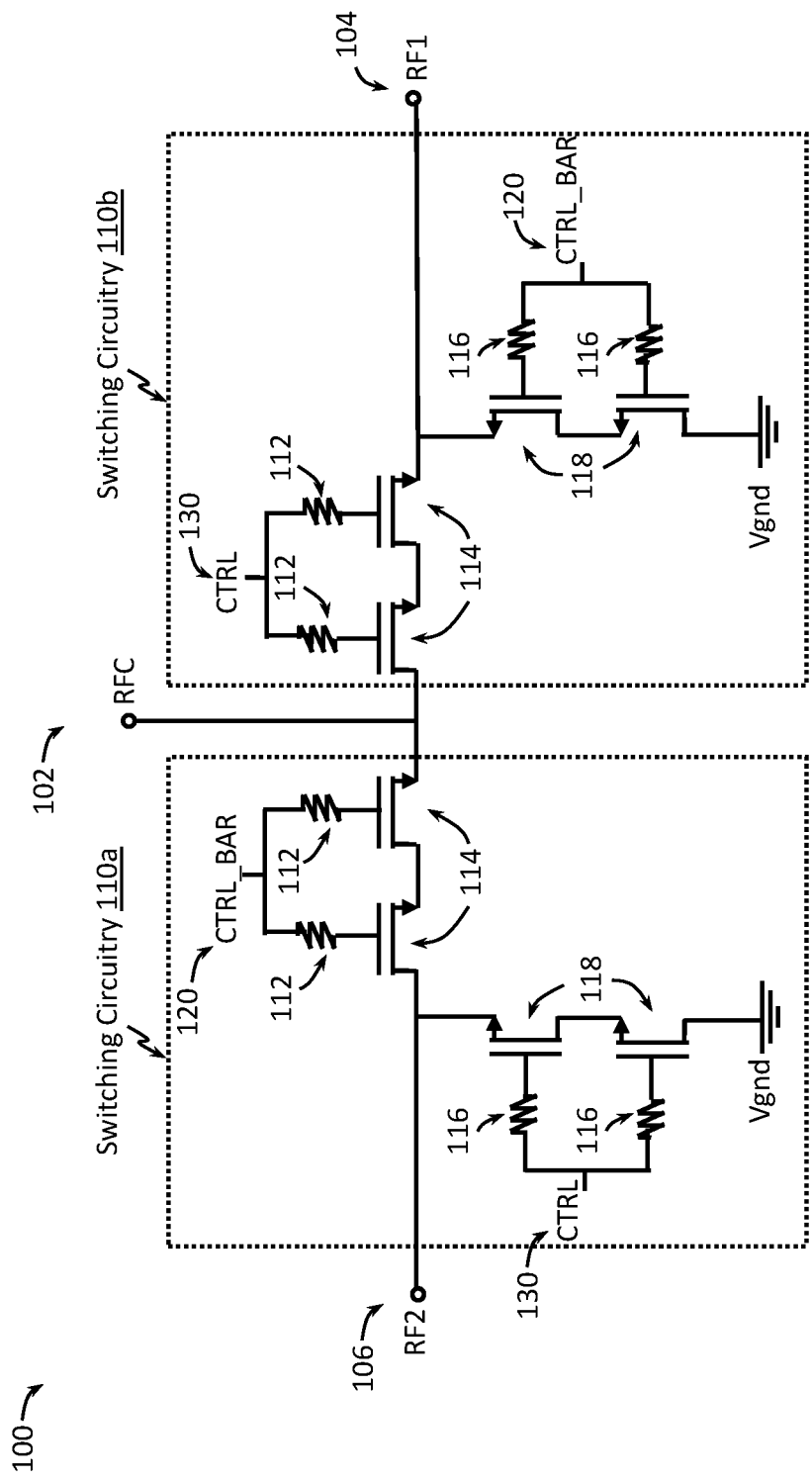
FIG. 1 is a schematic block diagram illustrating exemplary radio frequency (RF) switch circuitry.

The systems, methods and devices of this disclosure each have several innovative embodiments, no single one of which is solely responsible for all of the desirable attributes disclosed herein. Details of one or more implementations of the subject matter described in this specification are set forth in the description below and the accompanying drawings.

For purposes of illustrating high-linearity RF switch circuitry, it may be useful to understand operations of an RF switch circuitry. The following foundational information may be viewed as a basis from which the present disclosure may be properly explained. Such information is offered for purposes of explanation only and, accordingly, should not be construed in any way to limit the broad scope of the present disclosure and its potential applications.

As described above, inherent nonlinearity in RF switches can cause undesirable third-order intermodulation distortion (IMD3). One source of IMD3 in an RF switch may be due to switching circuitries in the RF switch. For instance, a single-pole double-throw (SPDT) RF switch circuitry may include a common port and two terminal ports (e.g., a first terminal port and a second terminal port) with switching circuitry between the common port and each common port. To route an input signal from the common port to a selected first terminal port, the switching circuitry (e.g., first switching circuitry) between the common port and the first terminal port may be configured to operate as a closed switch (to conduct the input signal from the common port to the first terminal port), and the switching circuitry (e.g., second switching circuitry) between the common port and the second terminal port may be configured to operate as an opened switch (to prevent the input signal from propagating to the second terminal port). Each switching circuitry may include one or more transistors such as metal-oxide-semiconductor (MOS) devices operating as switches to route the input signal to the first terminal port or to the second terminal port. Further, in some examples, each switching circuitry may also include one or more transistors that couple a corresponding terminal port to a ground potential in a shunt configuration. When the input signal is to be routed to the selected first terminal port, the shunt transistor(s) of the first switching circuitry (coupling the first terminal port to the common port) may operate as an opened switch, and the shunt transistor(s) of the second switching circuitry (coupling the first terminal port to the common port) may operate as a closed switch to further isolate the unselected second terminal port from the common port.

When using a MOS device as a switch, the drain and source voltages of the MOS device may be biased to a certain direct current (DC) level and a control pulse voltage can be applied to the gate terminal of the MOS device to cause the MOS device to operate as an opened switch or a closed switch. For instance, when the gate source voltage (which may be represented by $V_{GS}$) goes above a threshold level (which may be represented by $V_{th}$) specific to the MOS device characteristics, the MOS device is turned-on (operating as a closed switch). Conversely, when the gate source voltage $V_{GS}$ is below the threshold $V_{th}$, the MOS device is turned-off (operating as an opened switch). A turned-off MOS device may be modelled as a capacitor, whereas a turned-on MOS device may be modelled as a resistor. Because the equivalent resistance and capacitance of MOS devices may vary in a nonlinear fashion as the operating point of the MOS devices varies, the equivalent circuit components may have a high-order relationship that is nonlinear.

One approach to reducing undesirable nonlinearity or IMD3 in an RF switch is to select MOS devices that have a small resistance and/or a small capacitance. To achieve a smaller resistance and/or a smaller capacitance, the switch may a have larger size. However, a larger-size switch may be limited in providing a high switching speed and/or a high operating bandwidth, and thus may not be desirable. Other approaches may include utilizing different fabrication processes in making the RF switches to achieve reduced nonlinearity or reduced IMD3. However, these processes can be complex and costly.

The present disclosure describes mechanisms for providing high-linearity RF switch circuitry by including built-in nonlinearity cancellation circuitry. In one aspect of the present disclosure, example high-linearity RF switch circuitry may include a common port, two or more terminal ports, and two or more switching circuitries, where each switching circuitry may be coupled between the common port and an associated one of the two more terminal ports. As explained above, the two or more switching circuitries can generate nonlinear distortion (e.g., IMD3 caused by MOS devices in the switching circuitries). To provide a high linearity, the RF switch circuitry may include nonlinearity generation circuitry to purposefully generate a nonlinear signal and signal adjustment circuitry to adjust at least one of an amplitude or a phase of the nonlinear signal such that the adjusted nonlinear signal may have an amplitude that is substantially the same as an amplitude of remaining nonlinear distortion in the RF switch circuitry and a phase that is substantially opposite to a phase of the remaining nonlinear distortion. The amplitude and/or phase adjusted nonlinear signal may function as a nonlinearity cancellation signal that offsets the nonlinearity generated by the RF switch circuitry. In general, the cancellation does not need to be exactly opposite in phase and exactly equal in magnitude to the nonlinear distortion (e.g., IMD3) in the switching circuitries of the RF switch circuitry, but as long as the cancellation is close to opposite phase and equal magnitude to the nonlinear distortion, the cancellation can cancel at least a portion of the IMD3.

To provide nonlinearity cancellation, the nonlinearity generation circuity and the signal adjustment circuitry may be disposed along a shunt path coupled to the common port. For instance, the signal adjustment circuitry may be coupled to the common port, and the nonlinearity generation circuitry may be coupled between the signal adjustment circuitry and a ground potential. The signal adjustment circuitry may include at least a resistor connected in series with a capacitor. The nonlinearity generation circuitry may include one or more nonlinear generation devices, for example, one or more MOS devices connected in series (in a stack configuration). The gate terminals of the one or more MOS devices may be driven by a gate voltage that causes the one or more MOS devices to operate in an on-state irrespective of which of the terminal ports is selected.

In operation, the common port may receive an input signal and may drop or leak a small portion (e.g., less than about 1 percent (%) of the total input signal power) of the input signal to the shunt path. In general, the smaller the leak portion, the lower the insertion loss, and thus the better the performance. The signal adjustment circuitry may modify at least one of an amplitude (amplitude scaling) or a phase (phase-shift) of the first input signal portion. The first input signal portion may modulate an impedance of the one or more MOS devices to generate a nonlinear signal. As the generated nonlinear signal flows back to the common port, the signal adjustment circuitry may adjust at least one of any amplitude or a phase of the nonlinear signal. The adjusted nonlinear signal may be combined with the remaining portion of the input signal and routed to a selected terminal port. The resistor and the capacitor in the signal adjustment circuitry may be selected based on the characteristics of the MOS devices in the switching circuitries such that the adjusted nonlinear signal may have an amplitude that is substantially the same as an amplitude of nonlinear distortion caused by the MOS device and a phase that is substantially opposite to a phase of the nonlinear distortion. In this way, when the adjusted nonlinear signal is combined with the remaining portion of the input signal, the adjusted nonlinear signal effectively cancels or at least reduces the nonlinear distortion generated by the remaining circuitries (e.g., the switching circuitries) in the RF switch circuitry.

In some aspects, the RF switch circuitry may be an integrated RF switch device, for example, made of semiconductor materials. Because semiconductor fabrication or manufacturing processes (part-to-part or lot-to-lot) may vary, different RF switch devices may have different nonlinearity characteristics. Additionally, different RF channels (from one common port to another terminal port) may have different nonlinearity characteristics. Further, semiconductor materials may have varying characteristics at different operating temperatures, and thus the nonlinearity generated by an RF switch may vary as the temperature varies. Accordingly, in one aspect of the present disclosure, the nonlinearity generation circuitry may be an adjustable nonlinearity generation circuitry, meaning that the nonlinearity generation circuitry may be adjusted to generate a variable nonlinear signal (with a variable magnitude and/or a variable phase separate from the signal adjustment circuitry) to better match a nonlinear distortion of the RF switch devices. The signal adjustment circuitry may provide further magnitude and/or phase adjustment such that the generated nonlinear signal is in phase opposition to nonlinearity in the RF switch device, for example, at an output terminal of the RF switch circuitry.

In some aspects, the adjustable nonlinearity generation circuitry may include two or more MOS devices connected in series (in a stack configuration) for nonlinearity generation. Gate terminals of the two or more MOS devices may be driven by a variable gate voltage. The variable gate voltage may be set to different voltage levels to cause the two or more MOS devices to generate nonlinear signals with different amplitudes and/or different phases. In one example, the gate voltage level can be calibrated for each device to overcome part-to-part variations or lot-to-lot variations, for example, by determining a gate voltage level that can provide an optimal nonlinearity cancellation for each device. In another example, the gate voltage level can be calibrated for different RF switch terminal ports to overcome channel-to-channel variations in the same device, for example, by determining a gate voltage level that can provide an optimal nonlinearity cancellation for each terminal port. In a further example, the gate voltage level can be calibrated for different temperatures to overcome temperature variations, for example, by determining a gate voltage level that can provide an optimal nonlinearity cancellation at each temperature. In some instances, the variable gate voltage may be externally provided to the RF switch device. In other instances, the variable gate voltage may be supplied internally (on-chip) by the RF switch device and may further be controlled by an on-chip controller.

In some aspects, the adjustable nonlinearity generation circuitry may include at least one nonlinearity generation activation element that may selectively activate or deactivate at least one MOS device (e.g., a first MOS device) of the one or more MOS devices for generating nonlinearity. The nonlinearity generation activation element may be connected in parallel with the first MOS device and responsive to an activation control signal. In some aspects, the nonlinearity generation activation element may be another MOS device (e.g., a second MOS device), where a gate terminal of the second MOS device is driven by the activation control signal. In some aspects, each of the two or more MOS devices (nonlinearity generation devices) may be selectively activated or deactivated. For example, the adjustable nonlinearity generation circuitry may include a plurality of nonlinearity generation activation elements (e.g., MOS devices) connected in series and each nonlinearity generation activation element of the plurality of nonlinearity generation activation elements may be connected in parallel to one of the two or more MOS devices and responsive to an associated individual activation control signal. In some instances, the RF switch device may include an external interface for controlling each individual activation control signal.

In some aspects, post-production calibration may be performed for the integrated RF switch device. For instance, the integrated RF switch device may be calibrated to determine a suitable gate voltage level for driving the two or more MOS devices in the adjustable nonlinearity generation circuitry for linearity generation. Additionally or alternatively, the integrated RF switch device may be calibrated to determine a number of the two or more MOS devices in the adjustable nonlinearity generation circuitry to be activated for nonlinear generation. The determination of the suitable gate voltage level or the number of MOS devices for activation may be based on a measure of remaining nonlinearity (IMD3) in the RF switch device satisfying a certain threshold. The calibration result (e.g., indication of a suitable gate voltage level and/or indications of which of the MOS device(s) to be activated or deactivated for nonlinearity generation) may be recorded and stored at a memory of the integrated RF switch device. Subsequently, the gate voltage level and/or the activation control signals may be set for the integrated RF switch device according to the calibration data during runtime, for example, based on which of the terminal ports is selected and/or in a closed loop manner based on temperature monitoring.

The systems, schemes, and mechanisms described herein advantageously reduce nonlinearity distortion in RF switch circuitries using standard devices (e.g., MOS devices) without modifying fabrication processes. Further, the adjustable nonlinearity generation circuitry can provide flexibility to optimize nonlinearity cancellation through post-production calibration and/or closed-loop control during runtime. In some specific embodiments, the systems, schemes, and mechanisms described herein may cancel or reduce IMD3 to provide RF switches with a high IP3. While the present disclosure is described in the context of a SPDT RF switch circuitries, the present disclosure is suitable for use in any RF switches (e.g., single-pole single-throw (SPST), double-pole single-throw (DPST), double-pole double-throw (DPDT), single-pole four-throw (SP4T), four-pole single-throw (4PST), and/or amplifiers, etc.).

In general, the nonlinearity cancellation techniques described herein may be applied to any RF integrated circuit device having nonlinear circuitry arranged along a signal path between an input port and an output port of the device. For example, in some instances, the nonlinear circuitry may include switching circuitry that can be selected to route an input signal from the input port to the output port. In other instances, the nonlinear circuitry may include amplifier circuitry that can amplify an input signal received at the input port to provide an amplified signal at the output port. The switching circuitry and/or amplifier circuitry may include transistor(s) or MOS device(s) that can cause a nonlinear distortion to the output signal. The RF integrated circuit device may provide built-in (e.g., on-chip) nonlinearity cancellation by including a shunt path coupled to the signal path (e.g., at the input port, the output port, or any node along the signal path), where the shunt path may include signal adjustment circuitry and nonlinear generation circuitry (for linearization) connected in series and arranged between the signal path and a reference potential (e.g., a ground potential). The signal adjustment circuitry can include a passive network (e.g., with linear devices). The nonlinear generation circuitry can include one or more nonlinear devices (e.g., one or more MOS devices) and may include various activation controls and/or drive voltage controls for calibration.

Example RF Switch Circuitry

FIG. 1 is a schematic block diagram illustrating exemplary RF switch circuitry 100. The RF switch circuitry 100 is a SPDT switch including a common port 102 (a single-pole) and two terminal ports 104 and 106 (two-throw). The common port 102 may be referred to as an RFC port, the terminal port 104 may be referred to as an RF1 port, and the terminal port 106 may be referred to as an RF2 port. The RF switch circuitry 100 may further include switching circuitry 110 (shown as 110a and 110b) coupled between the common port 102 and each terminal port 104, 106. As shown, the switching circuitry 110a is coupled between the common port 102 and the terminal port 106, and the switching circuitry 110b is coupled between the common port 102 and the terminal port 104.

Each switching circuitry 110 may include MOS devices 114 (shown as N-type MOS (NMOS) devices) connected in series (in a stack configuration) operating as switches along a conducting path between the common port 102 and an associated one of the terminal port 104 or 106. More specifically, in each switching circuitry 110, the source terminal of one MOS device 114 may be coupled to the drain terminal of an adjacent MOS device 114, and the gate terminal of each MOS devices 114 may be coupled to a control voltage signal 120 or 130 (e.g., pulse voltage signal) via a corresponding resistor 112. The drain and source voltages of a MOS device 114 may be biased to a certain DC level, and a pulse voltage (e.g., the voltage signal 120 or 130) can be applied to the gate terminal of the MOS device to cause the MOS device to operate as an opened switch or as a closed switch. To that end, when the gate source voltage (which may be represented by $V_{GS}$) is above a threshold level (which may be represented by $V_{th}$) specific to the MOS device 114's characteristics, the MOS device 114 may be turned-on (operating as a closed switch). Conversely, when the gate source voltage $V_{GS}$ of the MOS device 114 is below the threshold $V_{th}$, the MOS device 114 may be turned-off (operating as an opened switch).

In the illustrated example of FIG. 1, the gate terminals of the MOS devices 114 in the switching circuitry 110b (between the common port 102 and the terminal port 104) are driven by the control voltage signal 130 represented by CTRL. The gate terminals of MOS devices 114 in the switching circuitry 110a (between the common port 102 and the terminal port 104) are driven by the control voltage signal 120 represented by CTRL_BAR, which is a complement of the CTRL. That is, when the control voltage signal 130 is a logic high (e.g., above $V_{th}$), the voltage signal 120 is a logic low (e.g., below $V_{th}$), or vice versa. In operation, to select the signal path from the common port 102 to the terminal port 104, the control voltage signal 130 may be set to a logic high so that the MOS devices 114 in the switching circuitry 110b are biased on (e.g., conducting), and the control voltage signal 120 may be set to a logic low so that the MOS devices 114 in the switching circuitry 110a are biased off (e.g., nonconducting) to decouple the unselected terminal port 106 from the common port 102. Conversely, to select the signal path from the common port 102 to the terminal port 106, the control voltage signal 120 may be set to a logic high so that the MOS devices 114 in the switching circuitry 110a are biased on, and the control voltage signal 130 may be set to a logic low so that the MOS devices 114 in the switching circuitry 110b are biased off to decouple the unselected terminal port 104 from the common port 102. Accordingly, the RF switch circuitry 100 can selectively route a signal from the common port 102 to the terminal port 104 or to the terminal port 106 by setting the control voltage signal 130 to a corresponding logic high or logic low and setting the control voltage signal 120 to a complement of the control voltage signal 130.

To provide better isolation between a selected path and an unselected path, each switching circuitry 110 may further include MOS devices 118 (shown as NMOS devices) connected in series (in a stack configuration) operating as switches along a shunt path between the common port 102 and a ground potential (which may be represented by Vgnd). The MOS devices 118 may be connected in substantially the same way as the stacked MOS devices 114. The gate terminal of each MOS device 118 may be coupled to a control voltage signal (via a corresponding resistor 116). The control voltage signal for each MOS device 118 may be a complement of the control voltage signal for the MOS devices 114 along the conducting path in the respective switching circuitry 110. As shown in the switching circuitry 110a, the gate terminals of the MOS devices 118 are driven by the control voltage signal 130 CTRL while the gate terminals of the MOS devices 114 are driven by the control voltage signal 120 CTRL_BAR. In a similar way, in the switching circuitry 110b, gate terminals of the MOS devices 118 are driven by the control voltage signal 120 CTRL_BAR while the gate terminals of the MOS devices 114 are driven by the control voltage signal 130 CTRL. Accordingly, in each switching circuitry 110, when the MOS devices 114 in the conducting path are configured to be on (to select an associated terminal port 104 or 106), the MOS devices 118 in the shunt path are configured to be off. Conversely, when the MOS devices 114 in the conducting path are configured to be off (to deselect an associated terminal port 104 or 106), the MOS devices 118 in the shunt path are configured to be on (to further isolate the associated unselected terminal port 104 or 106 from the common port 102).

While FIG. 1 illustrates the switching circuitries 110 utilizing NMOS devices (e.g., the MOS devices 114 and 118) for switching, aspects are not limited thereto. For instance, the switching circuitries 110 may implement switches using any suitable types of transistors (e.g., P-type MOS (PMOS) devices, positive-negative-positive (PNP) transistors, or negative-positive-negative (NPN) transistors). Further, each switching circuitry 110 may utilize any suitable number of MOS devices 114 (e.g., 1, 2, 3, 4, 5 or more) in a stacked configuration along the conducting path and/or any suitable number of MOS devices 118 (e.g., 1, 2, 3, 4, 5 or more) in a stacked configuration along the shunt path. In general, an RF switch may be implemented using the switching circuitry arrangement shown in FIG. 1 to provide selective switching between a common port and any suitable number of throw/terminal ports (e.g., 3, 4, 5, 6 or more). For instance, the same switching circuitry 110 can be replicated in order to add additional terminal ports. In addition, in some applications, a single terminal port may be coupled to the common port RFC, as in the case of a single pole, single throw (SPST) switch.

Example High-Linearity RF Switch Circuitry with Nonlinearity Cancellation Circuitry FIG. 2A is a schematic block diagram illustrating exemplary high-linearity RF switch circuitry 200 with built-in nonlinearity cancellation circuitry, according to some embodiments of the present disclosure. Generally speaking, the RF switch circuitry 200 may be similar to the RF switch circuitry 100 in many respects. For example, the RF switch circuitry 200 shares the same switching circuitries 110a and 110b between the common port 102 and the terminal ports 106 and 104, respectively, as the RF switch circuitry 200 of FIG. 1. However, FIG. 2A illustrates the MOS devices 114 and 118 by the equivalent circuit model in the switching circuitries 110a and 110b. In this regard, a turned-off MOS device may be modelled (e.g., lumped circuity equivalent) as a capacitor, whereas a turned-on MOS device may be modelled (e.g., the lumped circuity equivalent) as a resistor.

Figure 2:
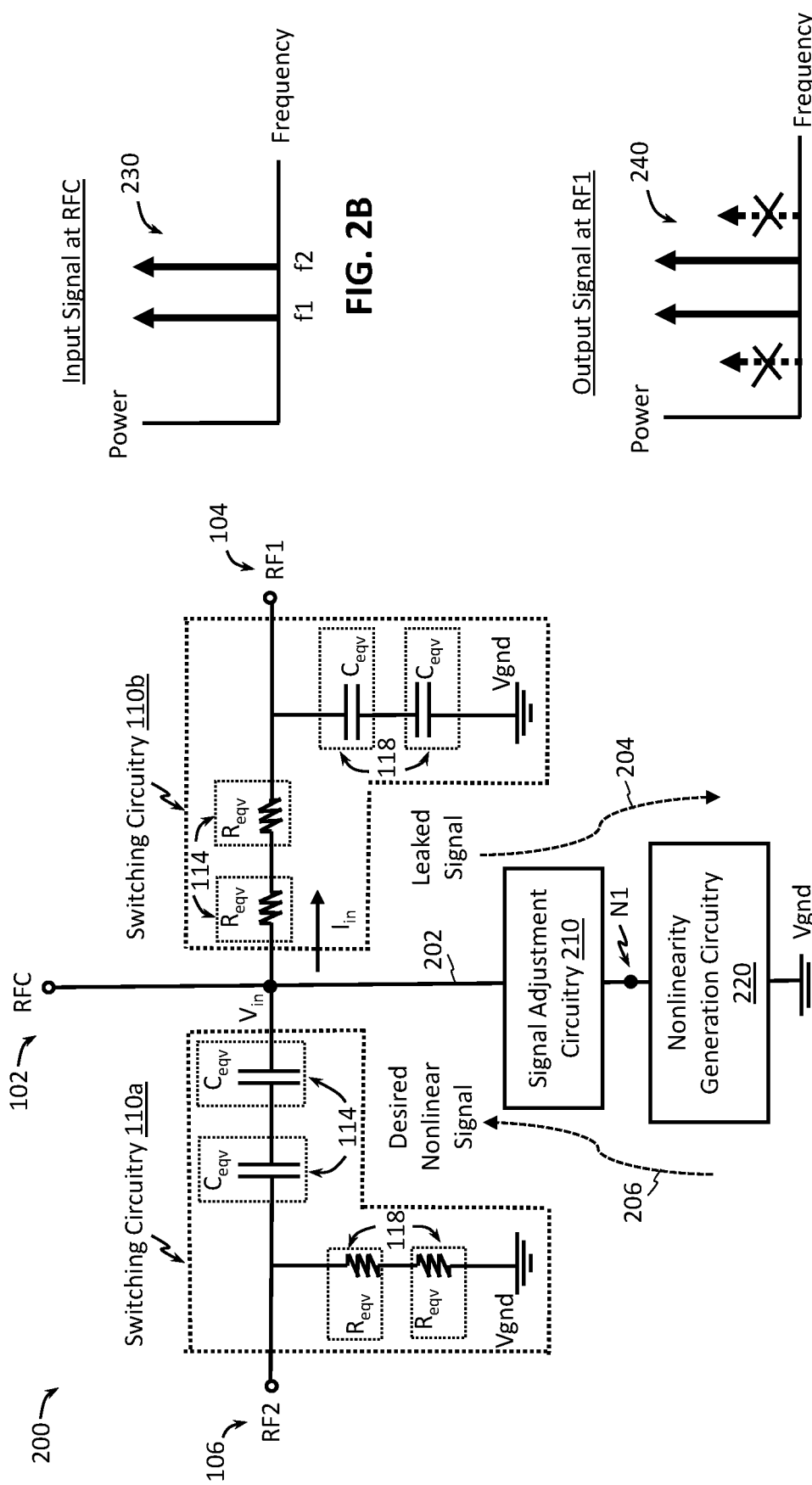
FIG. 2A is a schematic block diagram illustrating exemplary high-linearity RF switch circuitry with built-in nonlinearity cancellation circuitry, according to some embodiments of the present disclosure.
FIG. 2B is a graphical representation of an exemplary input RF signal at a common port of the high-linearity RF switch circuitry, according to some embodiments of the present disclosure.
FIG. 2C is a graphical representation of an exemplary output RF signal at a terminal port of the high-linearity RF switch circuitry, according to some embodiments of the present disclosure.

In the illustrated example of FIG. 2, the RF switch circuitry 200 is configured to conduct a signal from the common port 102 to the terminal port 104 (shown by the current $I_{in}$ flowing from the common port 102 to the terminal port 104). In this regard, to select the terminal port 104, the MOS devices 114 in the conducting path of the switching circuitry 110b are configured to be ON (e.g., the control voltage signal 130 set to a logic high) and the MOS devices 118 in the shunt path of the switching circuitry 110b are configured to be OFF (e.g., the control voltage signal 120 set to a logic low). As shown in FIG. 2, the on-state MOS devices 114 in the switching circuitry 110b are replaced by the equivalent resistors (represented by $R_{eqv}$) and the off-state MOS devices 118 in the switching circuitry 110b are replaced by the equivalent capacitors (represented by $C_{eqv}$). To deselect the terminal port 106, the MOS devices 114 in the conducting path of the switching circuitry 110a may be configured to be OFF (e.g., the control voltage signal 120 being a logic low) and the MOS devices 118 in the shunt path of the switching circuitry 110a may be configured to be ON (e.g., the control voltage signal 130 being a logic high). As shown in FIG. 2, the off-state MOS devices 114 in the switching circuitry 110a are replaced by the equivalent capacitors (represented by $C_{eqv}$) and the off-state MOS devices 118 in the switching circuitry 110a are replaced by the equivalent resistors (represented by $R_{eqv}$).

When an alternate current (AC) voltage is applied to a turned-off MOS device, or a current is applied to a turned-on MOS device, the equivalent resistance or capacitance associated with those devices may also vary due to changes of the operating points and therefore may operate in a nonlinear fashion. For instance, the equivalent circuit components may be modelled as a high-order polynomial as shown below:

$$C_{eqv}=C_0+C_1(V_{in})+C_2(V_{in})^2+C_3(V_{in})^3+C_4(V_{in})^4\ldots C_N(V_{in})^N, \quad (1)$$

$$R_{eqv}=R_0+R_1(I_{in})+R_2(I_{in})^2+R_3(I_{in})^3+R_4(I_{in})^4\ldots R_N(I_{in})^N, \quad (2)$$

where $V_{in}$ represents the input signal voltage at the common port 102, $C_0, C_1, C_2, C_3, C_4, \ldots, C_N$ represent capacitance associated with first, second, third, fourth, ... N-th orders, respectively, and $C_0, R_1, R_2, R_3, R_4, \ldots, R_N$ represent resistance associated with first, second, third, fourth, ... N-th orders, respectively. Having the high-order terms in equations (1) and (2) means that the $C_{eqv}$ and $R_{eqv}$ is nonlinear with respect to the input signal voltage. As such, the MOS devices 114 and 118 are nonlinear components that can generate nonlinear distortion.

To improve linearity or reduce the nonlinear distortion, the RF switch circuitry 200 further includes signal adjustment circuitry 210 and nonlinearity generation circuitry 220 connected in series along a shunt path 202 between the common port 102 and a ground potential $V_{gnd}$. That is, in some instances, the shunt path 202 may consist of the signal adjustment circuitry 210 and nonlinearity generation circuitry 220. The signal adjustment circuitry 210 and the nonlinearity generation circuitry 220 may operate together to cancel nonlinearity distortion in the RF switch circuitry. As such, the signal adjustment circuitry 210 and the nonlinearity generation circuitry 220 may be referred to as nonlinearity cancellation circuitry.

To provide nonlinearity cancellation, when an input signal is received at the common port 102 for switching to the terminal port 104 or 106, the RF switch circuitry 200 may leak a small portion of the input signal to the shunt path 202 for processing by the signal adjustment circuitry 210 and the nonlinearity generation circuitry 220 as shown by the arrow 204. To that end, the signal adjustment circuitry 210 may adjust the amplitude and/or phase of the input signal portion. The nonlinearity generation circuitry 220 may receive the adjusted input signal portion (e.g., at node N1). The nonlinearity generation circuitry 220 may be a passive circuit configured to purposely generate nonlinearity. For instance, the nonlinearity generation circuitry 220 may include nonlinear devices, such as transistors, diodes, or any components, with nonlinear impedance. The nonlinear devices may be modulated by the adjusted input signal portion to generate a nonlinear signal. The nonlinear signal may be pushed back to the common port 102 along the shunt path as shown by the arrow 206. As the nonlinear signal flows back to the common port 102, the signal adjustment circuitry 210 may adjust the amplitude and/or phase of the generated nonlinear signal. The signal adjustment circuitry 210 may include components selected to adjust the phase and/or amplitude of the input signal portion and the nonlinear signal such that the adjusted nonlinear signal (the desired nonlinear signal) at the common port 102 may have a phase about opposite to a phase of the nonlinear distortion generated by the remaining circuitry in the RF switch circuitry 200 and an amplitude substantially the same as the nonlinear distortion. The remaining portion of the input signal can be combined with the adjusted or desired nonlinear signal and routed to the terminal port 104. Because the adjusted nonlinear signal has about the same amplitude and about the opposite phase of the nonlinear distortion, the adjusted nonlinear signal can cancel the nonlinear distortion, and thus the combined signal routed to the terminal port 104 may have at least a reduced nonlinear distortion.

The amount of input signal power to be leaked to the shunt path 202 may be significantly less than the remaining portion of the input signal that is routed to the selected terminal port 104. The amount of leaked signal power may be dependent on various factors, such as the inherent nonlinearity in the components (e.g., the MOS devices 114 and 118) of the RF switch circuitry 200, the amount of nonlinearity that can be generated by the nonlinearity generation circuitry 220, the amount of amplitude and/or phase adjustment that can be provided by the signal adjustment circuitry 210. In some examples, the small input signal portion that is leaked to the shunt path 202 for nonlinearity generation may be less than about 1% of the total input signal power.

Because a certain portion of the input signal power is directed or leaked to the shunt path 202 for nonlinearity generation, it may be desirable to keep the leaked signal portion to be substantially small so that insertion loss may be minimized. In order to generate a sufficient amount of nonlinearity from the leaked signal portion for cancellation, the nonlinearity generation circuitry 220 may be a highly nonlinear block, meaning that it can generate a large nonlinearity with a small power as will be discussed more fully below.

As explained above, one form of nonlinear distortion is unwanted harmonics such as IMD3, which can impact the performance of an RF switch. FIGS. 2B and 2C illustrate examples of the RF switch circuitry 200 configured for cancelling or reducing IMD3 in the RF switch circuitry 200. In FIGS. 2B and 2C, the x-axes represent frequency in some units, and the y-axes represent power in some units.

FIG. 2B is a graphical representation of an exemplary input RF signal 230 received at the common port 102 of the high-linearity RF switch circuitry 200, according to some embodiments of the present disclosure. As shown, the input RF signal 230 includes two fundamental tones represented by f1 and f2.

FIG. 2C is a graphical representation of an exemplary output RF signal 240 at the terminal port 104 of the high-linearity RF switch circuitry 200, according to some embodiments of the present disclosure. As shown, the output RF signal 240 may have the same fundamental components at f1 and f2. In some instances, the fundamental components at f1 and f2 in the output RF signal 240 may have a lower power than the fundamental components at f1 and f2 in the input signal 230, for example, due to insertion loss. Additionally, the output RF signal 240 may also include harmonics (e.g., IMD3) shown by the dashed arrows at 2f1-f2 and 2f2-f1, due to the nonlinearity components in the switching circuitry 110 as discussed above with reference to equations (1) and (2). The power of these third-order components can grow at three times the rate of the power of the fundamental frequency components f1 and f2, and thus can impact the performance of the RF switch circuitry 200. However, because the RF switch circuitry 200 includes the signal adjustment circuitry 210 and the nonlinearity generation circuitry 220 that can operate to generate a nonlinear signal to counter offset the third-order components, the output RF signal 240 at the terminal port 104 may be free of the third-order components (shown by the symbols "X") or at least with reduced power for the third-order components.

Figure 3:
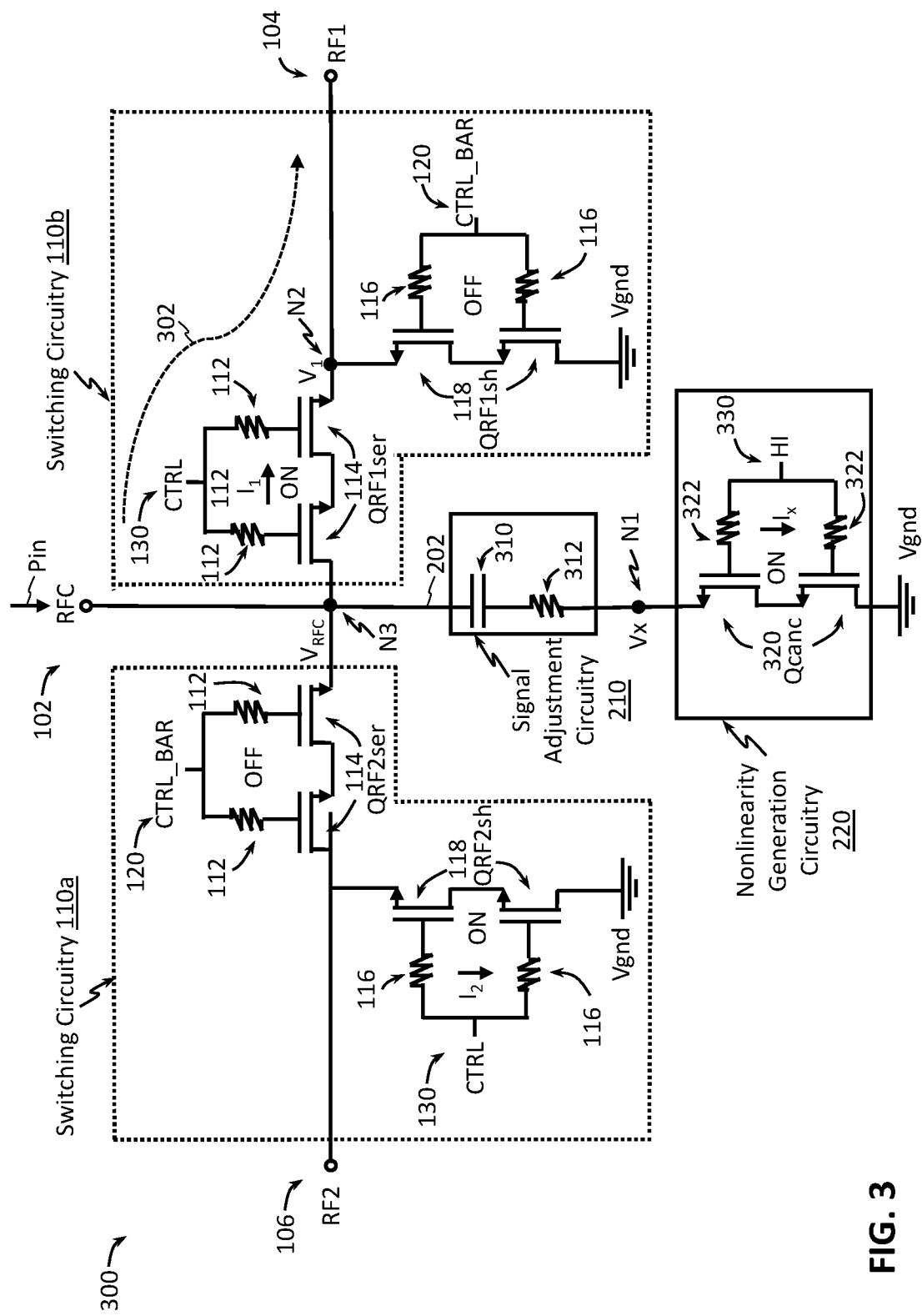
FIG. 3 is a schematic block diagram illustrating an exemplary high-linearity RF switch circuitry with built-in nonlinearity cancellation circuitry, according to some embodiments of the present disclosure.

FIG. 3 is a schematic block diagram illustrating an exemplary high-linearity RF switch circuitry 300 with built-in nonlinearity cancellation circuitry, according to some embodiments of the present disclosure. Generally speaking, the RF switch circuitry 300 may be similar to the RF switch circuitry 100 and 200 in many respects. For example, the RF switch circuitry 300 shares the same switching circuitries 110 as the RF switch circuitry 100 of FIG. 1 and the RF switch circuitry 200 of FIG. 2. For brevity's sake, a discussion of these circuitries is not repeated, and these circuitries may take the form of any embodiments disclosed herein. Further, similar to the RF switch circuitry 200 of FIG. 2, the RF switch circuitry 300 may include signal adjustment circuitry 210 and nonlinearity generation circuitry 220 to provide nonlinearity cancellation in the RF switch circuitry 300. FIG. 3 provides an exemplary circuity implementation for the signal adjustment circuitry 210 and the nonlinearity generation circuitry 220.

As shown in FIG. 3, the signal adjustment circuitry 210 may include a capacitor 310 and a resistor 312 connected in series between the common port 102 and the nonlinearity generation circuitry 220 to provide amplitude and/or phase adjustments. The nonlinearity generation circuitry 220 may include one or more MOS devices 320 (shown as NMOS devices and represented by $Q_{canc}$) connected in series between the signal adjustment circuitry 210 and a ground potential to generate a nonlinear signal (e.g., to cancel an arbitrary phase). In some instances, the signal adjustment circuitry 210 may include any suitable combination of a resistor, an inductor, and/or a capacitor (e.g., a passive network of linear components). In the illustrated example of FIG. 3, the nonlinearity generation circuitry 220 includes two MOS devices 320. The source terminal of one MOS device 320 may be coupled to the drain terminal of the adjacent MOS device 320 in a stacked configuration. The nonlinearity generation circuitry 220 may utilize MOS devices 320 operating in an on-state to generate nonlinearity irrespective of whether the terminal port 104 or the terminal port 106 is selected. As shown, the gate terminal of each MOS devices 320 is tied to a logic high provided by a control voltage signal 330 (e.g., pulse voltage signal) via a corresponding resistor 322.

In the illustrated example of FIG. 3, the RF switch circuitry 300 is configured to conduct an input signal, which may be represented by Pin, from the common port 102 to the terminal port 104 as shown by the dashed arrow 302. As shown, in the switching circuitry 110b, the MOS devices 114 (represented by QRF1ser) in the conducting path are configured to be ON and the MOS devices 118 (represented by QRF1sh) in the shunt path are configured to be OFF, whereas in the switching circuitry 110a, the MOS devices 114 (represented by QRF2ser) in the conducting path are configured to be off and the MOS devices 118 (represented by QRF2sh) in the shunt path are configured to be on.

In some embodiments, the IMD3 products generated by the switching circuitries 110 may be dominated by the turned-on QRF1ser (the MOS devices 114 in the conducting path of the switching circuitry 110b) and the turned-off QRF2ser (the MOS devices 114 in the conducting path of the switching circuitry 110a). For instance, QRF1ser and QRF2ser may be sized to be much larger than QRF1sh (the MOS devices 118 in the switching circuitry 110b) and QRF2sh (the MOS devices 118 in the switching circuitry 110a). For the same voltage swing, a turned-off MOS device will generate a much smaller IMD3 product if its total width (physical channel width) is smaller. Therefore, IMD3 products of QRF1sh may be significantly smaller than QRF2ser, and hence can be ignored. On the other hand, a smaller-sized turned-on MOS device may generate higher IMD3 products. However, the current (represented by $I_2$) through QRF2sh may be much smaller than the current (represented by $I_1$) through QRF1ser, and thus can be ignored.

In an example, the input signal Pin may have two tones (e.g., at f1 and f2 as shown in FIG. 2B). The two tones may have substantially the same input power and phase. The resulting IMD3 product by QRF1ser may have an amplitude of A1 and a phase of $\phi1$, whereas the IMD3 product by QRF2ser may have an amplitude of A2 and a phase of $\phi2$. The IMD3 product by QRF1ser may be represented in a vector form as A1<$\phi1$. The IMD3 product by QRF2ser may be represented in a vector form as A2<$\phi2$. Accordingly, the overall IMD3 product by the RF switch circuitry 300 is the summation of the two vectors A1<$\phi1$+A2<$\phi2$. The phase difference between the IMD3 products of an on device and the IMD3 product of an off device may be substantially constant and may be determined by the device model or device characteristics. Accordingly, in some embodiments, the component values for the capacitor 310 and the resistor 312 in the signal adjustment circuitry 210 may be selected based on the device characteristics of the MOS devices 114 and/or 118. For instance, the component values for the capacitor 310 and the resistor 312 in the signal adjustment circuitry 210 may be selected in accordance with the phase difference between ϕ1 and ϕ2. Additionally, the component values for the capacitor 310 and the resistor 312 in the signal adjustment circuitry 210 may be selected such that a voltage Vx at the node N1 (between the signal adjustment circuitry 210 and the nonlinearity generation circuitry 220) is substantially smaller than the voltage $V_{in}$ at the node N3 (the common port 102), for example, to minimize insertion loss. Further, the component values for the capacitor 310 and the resistor 312 in the signal adjustment circuitry 210 may be selected such that the dissipated power at the signal adjustment circuitry 210 is minimal.

In some embodiments, the MOS devices 320 used for the nonlinearity generation may be of the same type or same device model as the MOS devices 114. MOS devices of the same device type or the same device model may have similar characteristics (e.g., about the same threshold voltage $V_{TH}$, about the same resistance $R_{eqv}$ when biased on, and/or about the same capacitance $C_{eqv}$ when biased off). Thus, the MOS devices 320 may generate nonlinearity with about the same properties (e.g., phase) as the nonlinearity in the MOS devices 114. In other words, the cancellation phase may be self-aligned to the nonlinear distortion, and hence may ease the circuit implementation.

As explained above, the nonlinearity generation circuitry 220 may be configured to be a highly nonlinear block in order to generate a large nonlinear signal from a small portion of the input signal. For instance, the current (represented by $I_x$) flowing through the MOS devices 320 is significantly smaller than the current flowing through the MOS device 114 (QRF1ser) in the switching circuitry 110b. Accordingly, in some embodiments, the MOS devices 320 may be sized such that the width (channel width) of the MOS devices 320 is significantly smaller (e.g., in the order of 10 to 1000×, depending on the characteristics of the switch architecture and the MOS device) than the MOS devices 114 in order to generate nonlinearity with a sufficiently high level (large amplitude). In some embodiments, the nonlinearity generation circuitry 220 may increase the number of MOS devices 320 (e.g., 3, 4, 5, 6, 7, 8, 9, 10 or more) stacked together to increase nonlinearity generation.

In operation, the signal adjustment circuitry 210 and the nonlinearity generation circuitry 220 may perform substantially similar functions as discussed above with reference to FIG. 2A. For instance, the RF switch circuitry 300 may leak a small portion (e.g., less than about 1%) of the input signal Pin to the shunt path 202. The signal adjustment circuitry 210 may adjust the amplitude and/or phase of the input signal portion via the capacitor 310 and the resistor 312. The nonlinearity generation circuitry 220 may receive the adjusted input signal portion (e.g., at node N1). At the nonlinearity generation circuitry 220, the MOS devices 320 may be modulated by the adjusted input signal portion to generate a nonlinear signal. The nonlinear signal may flow back to the common port 102, and the signal adjustment circuitry 210 may adjust the amplitude and/or phase of the generated nonlinear signal via the capacitor 310 and the resistor 312. The capacitance of the capacitor 310 and the resistance of the resistor 312 can be selected to adjust the phase and/or amplitude of the input signal portion and the nonlinear signal such that the adjusted nonlinear signal (the desired nonlinear signal) at the common port 102 may have a phase about opposite to a phase of the nonlinear distortion generated by the remaining circuitry (e.g., the switching circuitries 110) in the RF switch circuitry 300 and an amplitude substantially the same as the nonlinear distortion. The remaining portion of the input signal Pin can be combined with the adjusted nonlinear signal and routed to the terminal port 104. Because the adjusted nonlinear signal has about the same amplitude and about the opposite phase of the nonlinear distortion, the adjusted nonlinear signal can cancel the nonlinear distortion, and thus the combined signal that is routed to the terminal port 104 may have at least a reduced nonlinear distortion.

The RF switching circuitry 300 can advantageously provide nonlinearity cancellation at any input signal power (i.e., not limited to a certain input power range) by modulating the nonlinear devices (the MOS devices 320) in the nonlinearity generation circuitry 220 with a portion of the input signal power so that amount of generated nonlinearity may increase as the input signal power increases. Further, by using the same MOS device type and/or MOS device model for the nonlinear generation devices (the MOS devices 320) and the switching elements (the MOS devices 114 and 118), the nonlinear generation devices may generate nonlinearity with about the same phase as the switching elements, and hence the signal adjustment circuitry 210 can easily shift the phase of the generated nonlinearity to be in phase opposition to the nonlinearity distortion caused by the switching elements. Since operations of the IMD generation circuitry (e.g., nonlinearity generation circuitry 220) is similar to the main switch elements (e.g., the switching circuitries 110), the IMD3 generation circuitry may experience substantially the same process variations as the main switch elements. Accordingly, the IMD generation circuitry can track the process variations at the main switch elements and provide a good cancellation across different process variations.

While FIG. 3 illustrates the signal adjustment circuitry 210 implemented as a series resistor-capacitor (RC) network and the nonlinearity generation circuitry 220 implemented using turned-on NMOS devices 320 for nonlinearity generation, aspects are not limited thereto. For instance, the signal adjustment circuitry 210 may utilize other combination of components, such as inductor(s), capacitor(s), and/or resistor(s), to provide amplitude and/or phase adjustment. The nonlinearity generation circuitry 220 may utilize other nonlinear devices, such as diodes, turned-off (biased-off) NMOS devices, PMOS devices, PNP transistors, and/or NPN transistors, to generate nonlinearity.

Figures 4A, 4B, 4C:
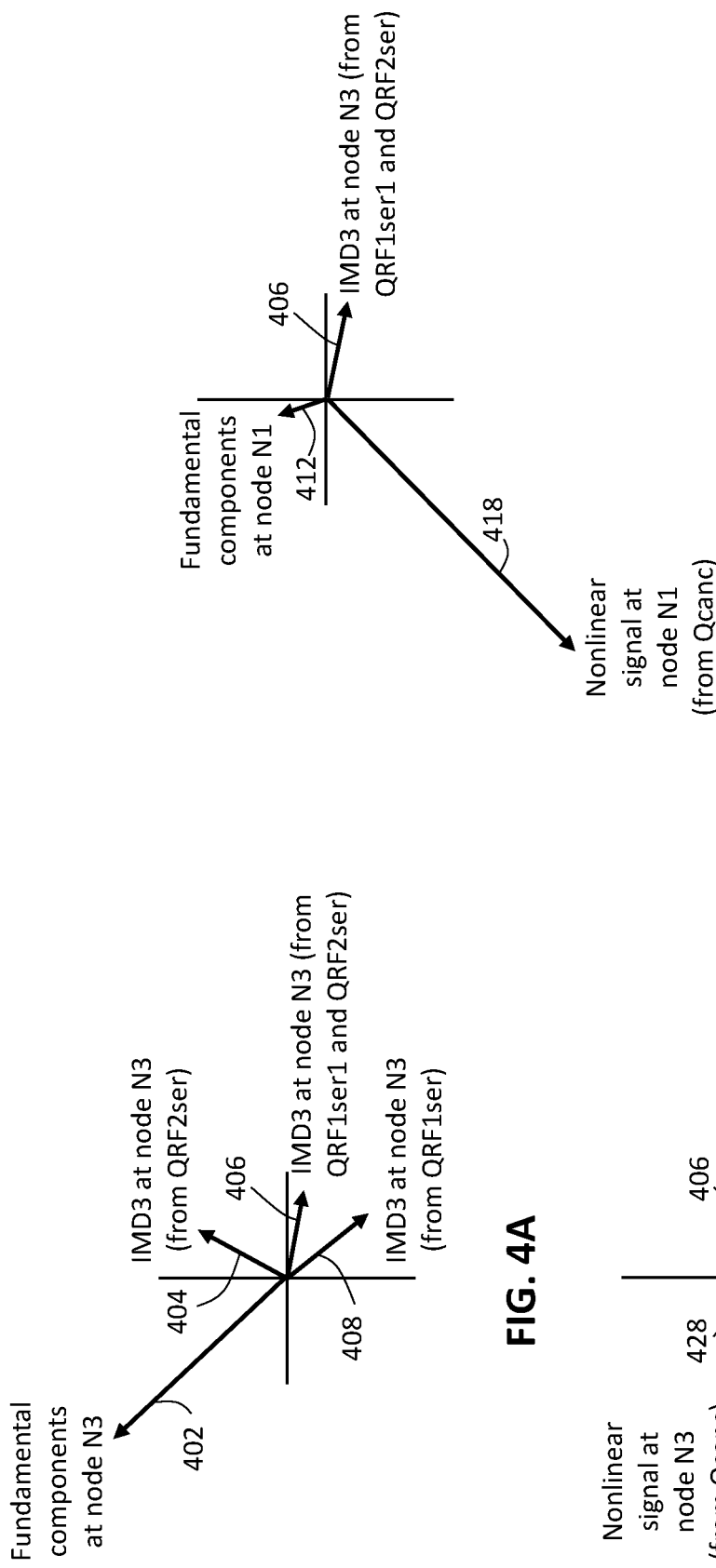
FIGS. 4A-4C are polar plots of signals/distortions at high-linearity RF switch circuitry, according to some embodiments of the present disclosure.

FIGS. 4A-4C are discussed in relation to FIG. 3 to further illustrate nonlinearity cancellation in the RF switch circuitry 300. FIG. 4A-4C are polar plots of signals and/or distortion at various nodes of the RF switch circuitry 300 of FIG. 3, according to some embodiments of the present disclosure. As an example, the input signal Pin entering the common port 102 may have two fundamental tones with a certain amplitude represented by $A_{in}$ and a certain phase represented by $\phi_{in}$. For simplicity of discussion, FIGS. 4A-4C may illustrate signal/distortion vectors for IMD3 cancellation. However, similar signal/distortion vectors may be constructed for other nonlinearity cancellation.

Referring to FIG. 4A, the vector 402 may represent the input signal with a fundamental tone having amplitude $A_{in}$ and the phase $\phi_{in}$ at node N3. The IMD3 tones due to QRF1ser (the MOS devices 114 in the conducting path of the switching circuitry 110b) at node N3 may have a phase ϕ1 and an amplitude A1 (represented by the vector 404). The IMD3 tones due to QRF2ser (the MOS devices 114 in the conducting path of the switching circuitry 110a) at node N3 may have a phase φ2 and an amplitude A2 (represented by the vector 408). The vector 406 represents the summation of the IMD3 tones due to QRF1ser and QRF2ser at the node N3.

As explained above, a small portion of the input signal is leaked into the shunt path 202. Referring to FIG. 4B, the vector 412 represents the small input signal portion (the fundamental tones in the voltage signal Vx) at the node N1 after a certain phase shift φX1 by the signal adjustment circuitry 210. The vector 406 is repeated here for reference. The vector 418 represents the nonlinear signal generated by the MOS devices 320 (Qcanc) of the nonlinearity generation circuitry 220. Since the phase of the fundamental tones is different at the node N1 than at the node N3, the phase of the IMD3 tones at the node N3 may be rotated by multiples of φX1. The multiplication factor (the multiples) may be dependent on the harmonic or distortion of interest. For instance, the multiplication factor may be about 3 for IMD3.

The nonlinear signal generated by the nonlinearity generation circuitry 220 may pass through the signal adjustment circuitry 210 with some attenuation and phase shift φX2 and appear at the node N3 (RFC). It should be noted that the phases φX1 and φX2 may not necessarily be the same due to different load conditions seen when passing from the node N3 to the node N1 versus passing from the node N1 to the node N3. Referring to FIG. 4C, the vector 428 represents the nonlinear signal generated by the MOS devices 320 (Qcanc) at the node N3. The vector 406 is repeated here for reference. If the phase shifts, attenuation factors, and the nonlinearity generation (IMD3 generation) are configured correctly, the resulting nonlinear signal (the vector 428) at the node N3 (RFC) may have an equal amplitude and an opposite phase of the IMD3 product (the vector 406) generated by the rest of the circuitry 300.

Figure 5:
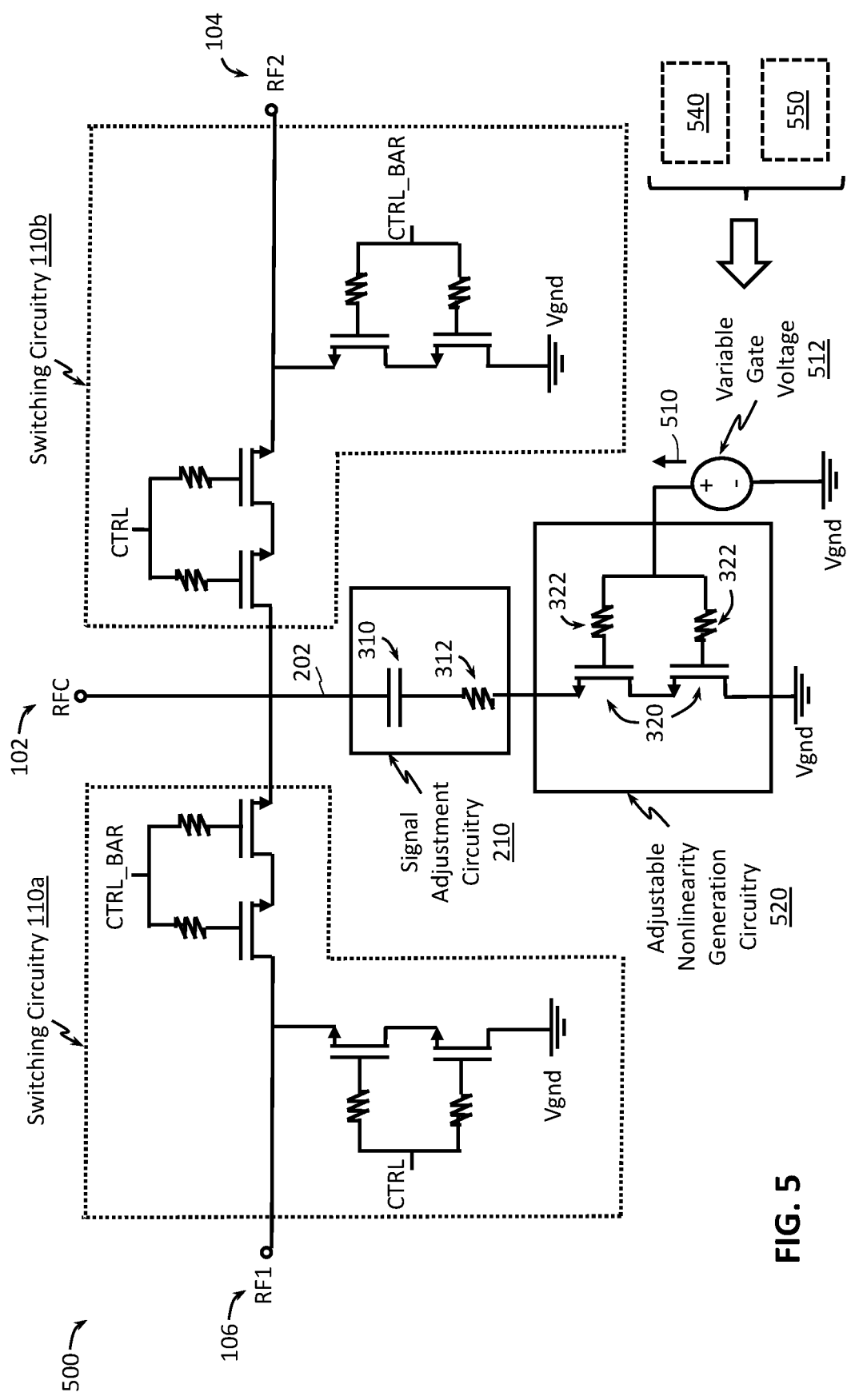
FIG. 5 is a schematic block diagram illustrating an exemplary high-linearity RF switch circuitry with built-in adjustable nonlinearity cancellation circuitry, according to some embodiments of the present disclosure.

Example High-Linearity RF Switch Circuitry with Adjustable Nonlinearity Cancellation Circuitry FIG. 5 is a schematic block diagram illustrating an exemplary high-linearity RF switch circuitry 500 with built-in adjustable nonlinearity cancellation circuitry, according to some embodiments of the present disclosure. Generally speaking, the RF switch circuitry 500 may be similar to the RF switch circuitry 300 in many respects. For example, the RF switch circuitry 500 shares the same circuitry including switching circuitries 110 and signal adjustment circuitry 210 as the RF switch circuitry 300 of FIG. 3. For brevity's sake, a discussion of these circuitries is not repeated, and these circuitries may take the form of any embodiments disclosed herein. Further, in order not to clutter drawings provided in FIG. 5, reference numerals are not shown for the components in the switching circuitries 110.

As shown in FIG. 5, the RF switch circuitry 500 may further include an adjustable nonlinearity generation circuitry 520. The adjustable nonlinearity generation circuitry 520 may include one or more MOS devices 320 (shown with two MOS devices 320) connected in series between the signal adjustment circuitry 210 and a ground potential (shown as Vgnd) to generate a nonlinear signal for nonlinearity cancellation in the RF switching circuitry 500. The gate terminals of the MOS devices 320 may be coupled to a variable gate voltage 512 (via respective resistors 322) instead of being tied to a logic high as in the RF switching circuitry 300 of FIG. 3. The variable gate voltage 512 may provide a variable gate voltage signal 510 at various voltage levels.

The MOS devices 320 may generate different nonlinearity when driven by gate voltages at different voltage levels. More specifically, when the gate terminals of the MOS devices 320 are driven by a first voltage level (provided by the variable gate voltage 512), the MOS devices 320 may generate a first nonlinear signal with a first amplitude and a first phase. When the gate terminals of the MOS devices 320 are driven by a second voltage level (provided by the variable gate voltage 512) different from the first voltage level, the MOS devices 320 may generate a second nonlinear signal with a second amplitude and a second phase. The first nonlinear signal and the second nonlinear signal may have different amplitudes and/or different phases. Accordingly, the nonlinearity generated by the adjustable nonlinearity generation circuitry 520 can be adjusted by varying the voltage level of the variable gate voltage 512, providing a first-degree of freedom for nonlinearity generation.

In some aspects, the RF switch circuitry 500 may be an integrated RF switch device made of semiconductor material (e.g., using silicon-on-insulator (SOI) process technology). Because semiconductor fabrication or manufacturing processes may vary, there may be lot-to-lot variations and/or part-to-part variations. Consequently, different RF switch devices may have different nonlinearity characteristics. Additionally, the conduction path or channel from the common port 102 to the terminal 104 and the conduction path or channel from the common port 102 to the terminal 106 on the same RF switch device 500 may have different nonlinearity characteristics. Further, the nonlinearity characteristics of the RF switch device 500 may also vary with temperatures. Accordingly, post-production calibration may be desirable. The provisioning of the variable gate voltage 512 in the RF switch device 500 may facilitate post-production calibration.

To perform post-production calibration, a test signal may be injected into the common port 102, the variable gate voltage signal 510 may be varied across a set of voltage levels to generate different nonlinear signals. The test signal may be any suitable type of signals for evaluating a nonlinearity of interest in the RF switch device 500. For example, to calibrate the RF switch device 500 for cancellation of IMD3, the test signal may have two tones similar to the signal 230 shown in FIG. 2B. For each gate voltage signal level, the nonlinearity (e.g., IMD3) of interest may be measured at the terminal port 104 (e.g., the switching circuitries 110a and 110b are configured to route the test signal to the terminal port 104) or at the terminal port 106 (e.g., the switching circuitries 110a and 110b are configured to route the test signal to the terminal port 106). The calibration may determine which of the gate voltage signal levels provides the lowest nonlinearity distortion of interest at the respective terminal port 104 or 106. In some examples, the lowest nonlinearity distortion may be based on a lowest nonlinearity distortion measurement for any one of the terminal port 104 or 106 across the voltage levels. In other examples, the lowest nonlinearity distortion may be based on a lowest averaged nonlinearity distortion measurements for the terminal ports 104 and 106 across the voltage levels. The calibration may further include generating calibration data indicative of the determined gate voltage signal level. Subsequently, the calibration data can be stored at an internal memory 540 (e.g., nonvolatile memory (NVM)) of the integrated RF switch device 500. During runtime, the variable gate voltage signal 510 may be set to a voltage level according to the calibration data (stored at the memory 540). The block arrow illustrates that the calibration data can be retrieved or read from the memory 540. Accordingly, the calibration may account for part-to-part variations and/or lot-to-lot variations.

As explained above, the semiconduction fabrication process variation can also cause variations in nonlinearity characteristics between different channels (e.g., from the common port 102 to the terminal port 104 versus from the common port 102 to the terminal 106) on the same device 500. Accordingly, in some embodiments, the calibration may determine a first optimal gate voltage signal level providing the lowest nonlinearity distortion of interest at the terminal port 104 when the terminal port 104 is selected and may determine a second optimal gate voltage signal level providing the lowest nonlinearity distortion of interest at the terminal port 106 when the terminal port 106 is selected. The calibration may include generating first calibration data indicative of the determined first gate voltage signal level and the corresponding terminal port 104 and an association between the first gate voltage signal level and the terminal port 104. The calibration may further include generating second calibration data indicative of the determined second gate voltage signal level and the corresponding terminal port 106 and an association between the second gate voltage and the terminal port 106. That is, the first calibration data is specific to the terminal port 104, and the second calibration data is specific to the terminal port 106. Subsequently, the first and second calibration data can be stored at the memory 540 of the integrated RF switch device 500. During runtime, the variable gate voltage signal 510 may be set to a voltage level according to the first calibration data (read from the memory 540) when the terminal port 104 is selected for transmission or according to the second calibration data (read from the memory 540) when the terminal port 106 is selected for transmission. Accordingly, the calibration may account for channel-to-channel variations within the same device.

In some embodiments, the calibration for each device part and/or each channel may be performed at a room temperature, and the calibration data for the room temperature may be stored at the memory 540. During runtime, temperature compensation can be performed independently to adjust the level of the gate voltage 512. For example, a monitoring circuitry 550 (e.g., a controller) may be configured to monitor a current operating temperature of the RF switch device 500, and set the variable gate voltage 512 in a closed loop manner. The block arrow further illustrates that the monitoring circuitry 550 can control the level of the variable gate voltage signal 510. To that end, the level for the gate voltage signal 510 may be determined according to the calibration data (calibrated for the room temperature) stored at the memory 540 with an adjustment based on the current operating temperature. Accordingly, the setting of the variable gate voltage 512 may account for temperature variations.

In other embodiments, the calibration may include varying the operating temperature of the integrated RF switch device 500 over a certain range of operating temperatures. For each temperature, the calibration may determine an optimal gate voltage signal level providing the lowest nonlinearity distortion of interest at the terminal port 104 when the terminal port 104 is selected or at the terminal port 106 when the terminal port 106 is selected. The calibration may include generating calibration data indicative of the determined gate voltage signal level and the corresponding temperature for each temperature. That is, each calibration data is specific to an operating temperature. Subsequently, the calibration data for each temperature can be stored at the memory 540 of the integrated RF switch device 500. During runtime, the variable gate voltage signal 510 may be set to a voltage level according to calibration data for a temperature corresponding to a current operating temperature detected by the monitoring circuitry 550.

In some embodiments, the variable gate voltage 512 may be generated internally (on-chip) at the RF switch device 500, for example, via a voltage divider or any suitable voltage generation circuitry. Further, the monitoring circuitry 550 can be internal at the RF switch device 500. In other embodiments, the variable gate voltage 512 may be externally supplied to the RF switch device 500. For example, the RF switch device 500 may include an external input for receiving the variable gate voltage signal 510. In any case, the variable gate voltage 512 may be set according to the calibration data stored in the internal memory 540.

In general, post-production calibration can include any suitable combination of temperature calibration, channel calibration, and/or parts calibration to eliminate process-indued errors (e.g., lot-to-lot variations, part-to-part variations, channel-to-channel variations, and/or temperature variations). For instance, in some examples, the memory 540 may store calibration data including a suitable or optimal voltage level for the gate voltage signal 510 for the specific device 500 (e.g., operating at a room temperature). In some examples, the memory 540 may store calibration data including a suitable or optimal voltage level for the gate voltage signal 510 for each selected terminal port 104 or 106 (e.g., operating at a room temperature). In some examples, the memory 540 may store calibration data including a suitable or optimal voltage level for the gate voltage signal 510 for each temperature over a range of operating temperatures. In some examples, the memory 540 may store calibration data including a suitable or optimal voltage level for the gate voltage signal 510 for each temperature over a range of operating temperatures and for each selected terminal port 104 or selected terminal 106. For instance, the memory 540 may store a lookup table for each temperature.

Figure 6:
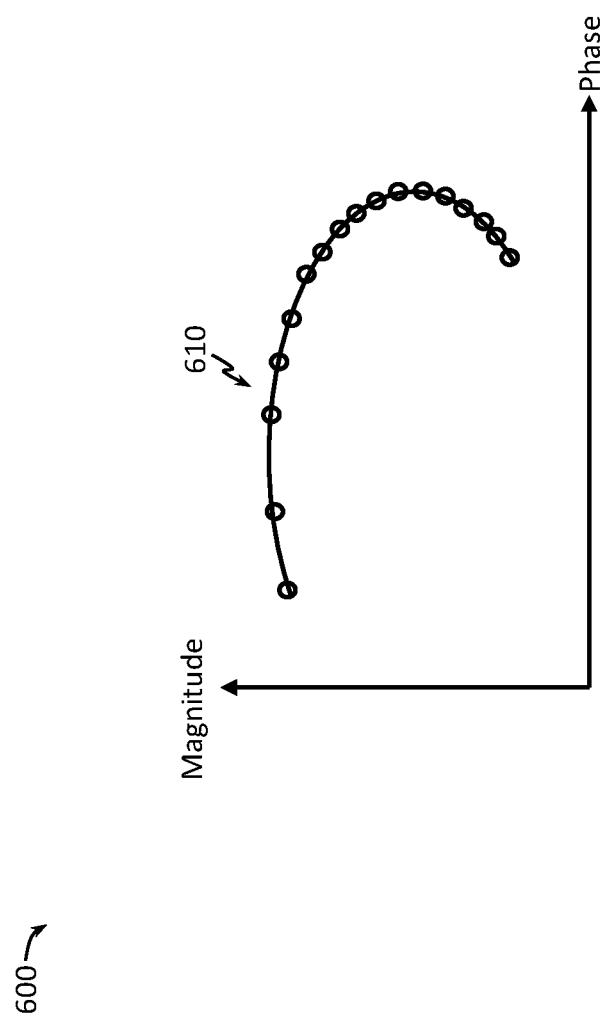
FIG. 6 is a graphical representation of an exemplary nonlinearity generation curve, according to some embodiments of the present disclosure.

FIG. 6 is a graphical representation 600 of an exemplary nonlinearity cancellation solution curve 610, according to some embodiments of the present disclosure. In FIG. 6, the x-axis may represent phases in some units, and the y-axis may represent magnitudes in some units. The curve 610 may represent a range of magnitudes and phases of nonlinearity that the adjustable nonlinearity generation circuitry 520 may generate. Each point (e.g., the empty circles) on the curve 610 may correspond to a particular voltage level of the variable gate voltage signal 510. In other words, any point on the curve 610 can be selected for nonlinearity generation by setting the variable gate voltage signal 510 to a respective voltage level.

Figure 7:
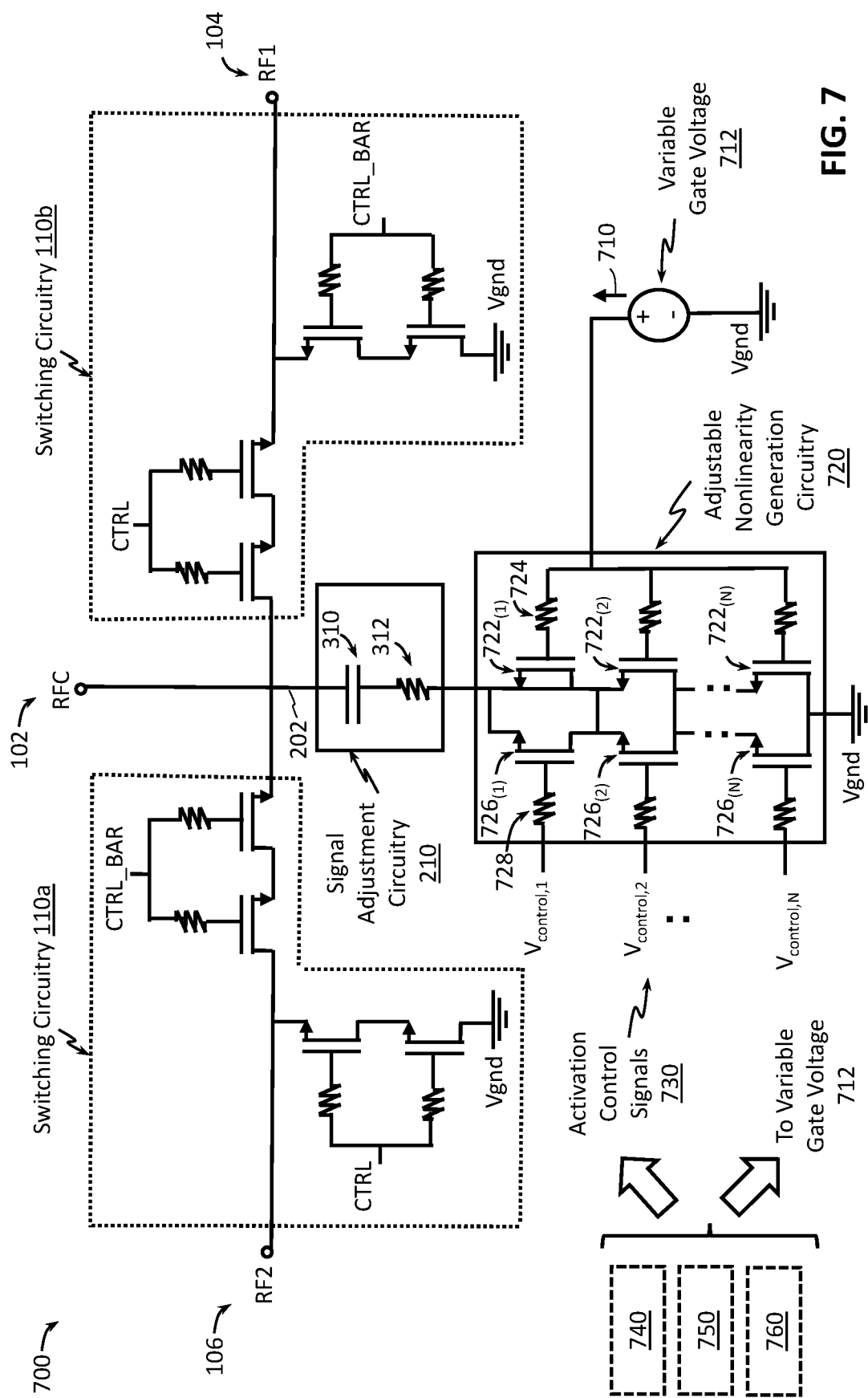
FIG. 7 is a schematic block diagram illustrating an exemplary high-linearity RF switch circuitry with built-in adjustable nonlinearity cancellation circuitry, according to some embodiments of the present disclosure.

FIG. 7 is a schematic block diagram illustrating an exemplary high-linearity RF switch circuitry 700 with built-in adjustable nonlinearity cancellation circuitry, according to some embodiments of the present disclosure. Generally speaking, the RF switch circuitry 700 may be similar to the RF switch circuitry 500 in many respects. For example, the RF switch circuitry 700 shares the same circuitry including switching circuitries 110 and the signal adjustment circuitry 210 as the RF switch circuitry 500 of FIG. 5. For brevity's sake, a discussion of these circuitries is not repeated, and these circuitries may take the form of any embodiments disclosed herein. Further, in order not to clutter drawings provided in FIG. 7, reference numerals are not shown for the components in the switching circuitries 110.

As shown in FIG. 7, the RF switch circuitry 700 may further include an adjustable nonlinearity generation circuitry 720. The adjustable nonlinearity generation circuitry 720 may include two or more MOS devices 722 (e.g., N number of MOS device 722 shown as $722_{(1)}$, $722_{(2)}$, . . . , $722_{(N)}$) connected in series between the signal adjustment circuitry 210 and a ground potential (shown as Vgnd) to generate a nonlinear signal for nonlinearity cancellation in the RF switching circuitry 700. The gate terminals of the MOS devices 722 may be coupled to a variable gate voltage 712 via respective resistors 724. The variable gate voltage 712 may provide a variable gate voltage signal 710. The MOS devices 722 may be substantially similar to the MOS devices 320. The resistors 724 may be substantially similar to the resistors 322. The variable gate voltage 712 may be substantially similar to the variable gate voltage 512, for example, set to various voltage levels to provide a first-degree of freedom for nonlinearity generation.

To provide further adjustability for nonlinearity generation (e.g., a second-degree of freedom), the adjustable nonlinearity generation circuitry 720 may further include a plurality of nonlinearity generation activation elements, each operable to selectively activate or deactivate one of the MOS devices 722 for nonlinearity generation. In other words, the adjustable nonlinearity generation circuitry 720 may have a variable number of activated MOS devices 722. For instance, the greater number of activated MOS devices 722 (nonlinearity generation MOS devices), the greater amount of nonlinearity may be generated by the adjustable nonlinearity generation circuitry 720.

In the illustrated example of FIG. 7, the nonlinearity generation activation elements are MOS devices 726 (shown as $726_{(1)}$, $726_{(2)}$, . . . , $726_{(N)}$), which may be referred to as activation MOS devices. As shown, the activation MOS devices 726 are connected in series (in a stack configuration), where the source terminal of one MOS device 726 may be coupled to the drain terminal of an adjacent MOS device 726. Further, each activation MOS device 726 may be connected in parallel with an associated one of the MOS device 722. More specifically, the source terminal of the MOS device 726 is connected to the source terminal of the MOS device 722, and the drain terminal of the MOS device 726 is connected to the drain terminal of the MOS device 722. For instance, the MOS device $726_{(1)}$ is connected in parallel with the MOS device $722_{(1)}$, the MOS device $726_{(2)}$ is connected in parallel with the MOS device $722_{(2)}$, and so on.

As further shown in FIG. 7, the gate terminals of activation MOS devices 726 may be driven by activation control signals 730 (shown as $V_{control,1}$, $V_{control,2}$, $V_{control,N}$) via respective resistors 728. For instance, the gate terminal of the MOS device $726_{(1)}$ is driven by activation control signals 730 $V_{control,1}$, the gate terminal of the MOS device $726_{(2)}$ is driven by activation control signals 730 $V_{control,2}$, and so on. The activation MOS device 726 may selectively activate or deactivate a corresponding MOS device 722 for nonlinearity generation based on an associated activation control signal 730. More specifically, the activation control signals 730 $V_{control,i}$ for an activation MOS device $726_{(i)}$ may be set to a logic low to activate a corresponding MOS device $722_{(i)}$ for nonlinearity generation, where i may be 1, 2, . . . , or N.

As an example, each MOS device $722_{(i)}$ may generate a nonlinearity of X decibel-milliwatt (dBm). If the activation control signals 730 $V_{control,i}$ is set to a logic low, the activation MOS device $726_{(i)}$ may operate in an off-state, and the corresponding MOS device $722_{(i)}$ may generate the same amount of nonlinearity of X dBm. That is, the MOS device $722_{(i)}$ is activated to generate the nonlinearity of X dBm. If, however, the activation control signals 730 $V_{control,i}$ is set to a logic high, the activation MOS device $726_{(i)}$ may operate in an on-state, and the corresponding MOS device $722_{(i)}$ may be deactivated to generate the XdBm of nonlinearity. For instance, if the activation MOS device $726_{(i)}$ has the same size as the MOS device $722_{(i)}$, then the effective MOS device size is doubled, and the amount of nonlinearity generated may be X-18 dBm, which is substantially negligible. In other words, the MOS device $722_{(i)}$ is deactivated to generate the X dBm of nonlinearity. Alternatively, if the activation MOS device $726_{(i)}$ has a larger size than the size than the MOS device $722_{(i)}$, for example, by about four times, then the amount of nonlinearity generated may be X-36 dBm, which is completely negligible. Again, the MOS device $722_{(i)}$ is deactivated to generate the X dBm of nonlinearity. As can be observed, the number of nonlinearity generation stacked MOS devices 722 in the adjustable nonlinearity generation circuitry 720 can be increased to provide more flexibility in generating various amount of nonlinearity. For example, N may be 2, 3, 4, 5, 6, 7, 8, 9, 10 or more. Further, the size of the nonlinearity generation stacked MOS devices 722 can be selected to provide a certain nonlinearity generation resolution. The selective activation or deactivation of each nonlinearity generation MOS device 722 thus provides a second-degree of freedom for nonlinearity generation.

In some aspects, the RF switch circuitry 700 may be an integrated RF switch device made of semiconductor material. As explained above, because semiconductor fabrication or manufacturing processes may vary, there may be lot-to-lot variations and/or part-to-part variations. Consequently, different RF switch devices may have different nonlinearity characteristics, different channels across a certain RF switch device may have different, and/or different operating temperature may cause an RF switch device to have different nonlinearity characteristics. The provisioning of the variable gate control voltage 710 to the nonlinearity generation MOS devices 722 and the selective activation or deactivation of each individual nonlinearity generation MOS device 722 can thus facilitate post-production calibration.

Post-production calibration may be performed on the RF switch device 700 in a similar way as for the RF switch device 500. For instance, a test signal may be injected into the common port 102, the variable gate voltage signal 710 may be varied across a set of voltage signal levels to generate different nonlinear signals as discussed above with reference to FIG. 5. However, additionally, the different subsets of the nonlinearity generation MOS devices 722 may be activated to generate different nonlinear signals. The calibration may determine a combination of a voltage signal level for the variable gate voltage signal 710 and a subset of the nonlinearity generation MOS devices 722 to be activated to provide a lowest nonlinearity distortion of interest for the RF switch device 700. To that end, for each gate voltage signal 710 level, the calibration may determine a nonlinearity measure for each subset of the nonlinearity generation MOS devices 722 at the terminal port 104 when the terminal port 104 is selected. Similarly, for each subset of nonlinearity generation MOS devices 722 being activated, the calibration may determine a nonlinearity measure at the terminal port 106 when the terminal port 106 is selected. In some instances, the calibration may determine the lowest nonlinearity distortion based on a lowest nonlinearity measure for any one of the terminal port 104 or the terminal port 106. In other instances, the calibration may determine the lowest nonlinearity distortion based on a lowest nonlinearity measure based on a lowest averaged nonlinearity distortion measurement for the terminal port 104 and the terminal port 106.

The calibration may further include generating calibration data indicative of the determined gate voltage signal level and determined subset of nonlinearity generation MOS devices 722 to be activated. In some examples, the calibration data may include a control word including a set of bits, each corresponding to one of the activation control signals 730. For example, a bit-value of 1 may indicate a logic high to be set for the corresponding activation control signal 730, whereas a bit-value of 0 may indicate a logic low to be set for the corresponding activation control signal 730. Thus, the set of bits may indicate how each of the individual activation control signals 730 may be set concurrently to trigger the adjustable nonlinearity generation circuitry 720 to generate a certain nonlinearity for nonlinearity cancellation. Subsequently, the calibration data can be stored at an internal memory 740 (e.g., NVM) of the integrated RF switch device 700. During runtime, the variable gate voltage signal 710 may be set to a voltage level and each individual activation control signal 730 may be set to a logic high or a logic low according to the calibration data (stored at the memory 740). The block arrows illustrate that the calibration data can be retrieved or read from the memory 740. Accordingly, the calibration may account for lot-to-lot variations and /or part-to-part variations.

To account for nonlinearity variations across channels on the same RF switch device 700, the calibration may include determining a combination of a voltage signal level for the variable gate voltage signal 710 and a subset of the nonlinearity generation MOS devices 722 to be activated to provide a lowest nonlinearity distortion of interest for each terminal port 104, 106 of the RF switch device 700. The calibration may include generating calibration data indicative of the determined gate voltage signal level and determined subset of nonlinearity generation MOS devices 722 to be activated (e.g., via a control word for setting the activation control signals 730) for each of the terminal ports 104 or 106 and an association to the corresponding terminal port 104 or 106. That is, each calibration data is specific to a particular terminal port 104 or 106. Subsequently, the calibration data for each terminal port 104 and 106 may be stored at the memory 740. During runtime, the variable gate voltage signal 710 may be set to a voltage level and each individual activation control signal 730 may be set to a logic high or a logic low according to the stored calibration data corresponding to a selected terminal port 104 or 106.

In some embodiments, the calibration for each device part and/or each channel may be performed at a room temperature, and the calibration data for the room temperature may be stored at the memory 740. During runtime, a monitoring circuitry 750 (e.g., a controller) may be configured to monitor a current operating temperature of the RF switch device 700, and the variable gate voltage 712 may be set in a closed loop manner as discussed above with reference to FIG. 5. The block arrows further illustrate that the monitoring circuitry 750 can control the level variable gate voltage signal 710 and/or each activation control signal 730. In other embodiments, the calibration may be performed at various temperature over an operating temperature range. The calibration may include determining a combination of a voltage signal level for the variable gate voltage signal 710 and a subset of the nonlinearity generation MOS devices 722 to be activated to provide a lowest nonlinearity distortion of interest for each terminal port 104, 106 of the RF switch device 700 for each temperature in the range. The calibration may include generating calibration data indicative of the determined gate voltage signal level and determined subset of nonlinearity generation MOS devices 722 to be activated (e.g., via a control word for setting the activation control signals 730) for each terminal port 104, 106 and each temperate in the range. That is, each calibration data is specific to an operating temperature. Subsequently, the calibration data for each temperature may be stored at the memory 740. During runtime, the variable gate voltage signal 710 may be set to a voltage level and each individual activation control signal 730 may be set to a logic high or a logic low according to the calibration data corresponding to a selected terminal port 104 or 106 and the current operating temperature. In some instances, the variable gate control voltage signal 710 and the activation control signals 730 may be configured based on temperature monitoring (e.g., via monitoring circuitry 750 similar to the monitoring circuitry 550) in a closed loop manner.

In some embodiments, the variable gate voltage 712 may be generated internally (on-chip) at the RF switch device 700, for example, via a voltage divider or any suitable voltage generation circuitry. Further, the monitoring circuitry 750 can be internal at the RF switch device 700. In other embodiments, the variable gate voltage 712 may be externally supplied to the RF switch device 700. For example, the RF switch device 700 may include an external input for receiving the variable gate voltage signal 710. In any case, the variable gate voltage 712 may be set according to the calibration data stored in the internal memory 740.

In some embodiments, the activation control signals 730 may be generated internally (on-chip) at the RF switch device 700. For instance, the RF switch device 700 may include an external interface (e.g., serial peripheral interface (SPI)) to enable a user or an application to program a control register 760 in the RF switch device 700 to set each activation control signal 730 to a logic high or a logic low. The block arrows further illustrate that the control register 760 can control the settings for the activation control signal 730. Further, the monitoring circuitry 750 can be internal at the RF switch device 700. In other embodiments, the activation control signals 730 may be externally supplied to the RF switch device 700. For example, the RF switch device 700 may include external input(s) for receiving the activation control signals 730. In any case, the activation control signals 730 may be set according to the calibration data in the memory 740.

In general, post-production calibration can include any suitable combination of temperature calibration, channel calibration, and/or parts calibration to eliminate process-induced errors (e.g., lot-to-lot variations, part-to-part variations, channel-to-channel variations, and/or temperature variations). For instance, in some examples, the memory 740 may store calibration data including a suitable or optimal voltage level for the gate voltage signal 510 and a control word for setting the activation control signals 730 for the specific device 700 (e.g., operating at a room temperature). In some examples, the memory 740 may store calibration data including a suitable or optimal voltage level for the gate voltage signal 710 and a control word for setting the activation control signals 730 for each selected terminal port 104 or 106 (e.g., operating at a room temperature). In some examples, the memory 740 may store calibration data including a suitable or optimal voltage level for the gate voltage signal 710 and a control word for setting the activation control signals 730 for each temperature over a range of operating temperatures. In some examples, the memory 740 may store calibration data including a suitable or optimal voltage level for the gate voltage signal 710 and a control word for setting the activation control signals 730 for each temperature over a range of operating temperatures and for each selected terminal port 104 or selected terminal port 106. For instance, the memory 740 may store a lookup table for each temperature.

While FIG. 7 illustrates the adjustable nonlinearity generation circuitry 720 including selective activation or deactivation for each nonlinearity generation MOS device 722 (via a respective activation MOS device 726 and activation control signal 730), aspects are not limited thereto. For example, the adjustable nonlinearity generation circuitry 720 may include one or more of the nonlinearity generation MOS devices 722 to be always activated for nonlinearity generation, while remaining nonlinearity generation MOS devices 722 may be selectively activated or deactivated via corresponding activation MOS devices 726 and associated activation control signals 730. Further, in some examples, the gate voltage signal 710 may be set to a fixed voltage level, and activation control signals 730 may be set to provide the variable nonlinearity generation.

Figure 8:
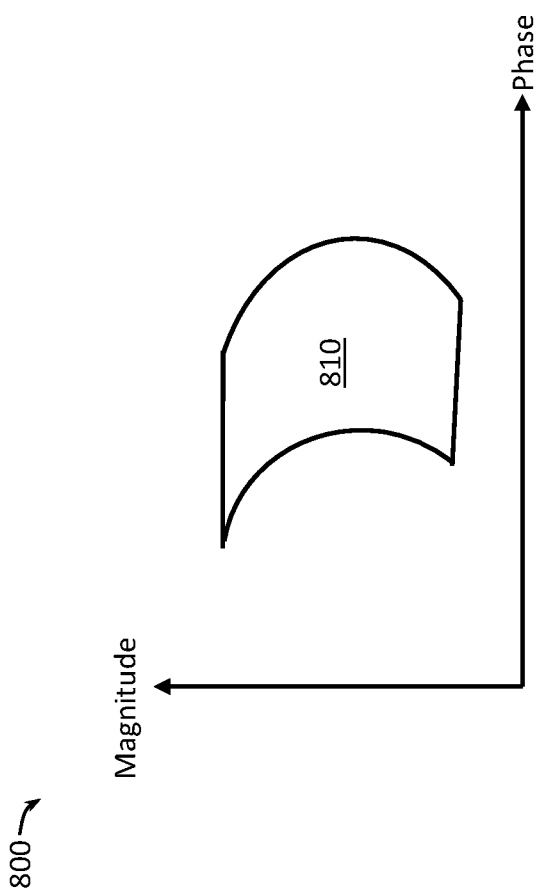
FIG. 8 is a graphical representation of an exemplary nonlinearity cancellation solution area, according to some embodiments of the present disclosure.

FIG. 8 is a graphical representation 800 of an exemplary nonlinearity cancellation solution area 810, according to some embodiments of the present disclosure. In FIG. 8, the x-axis may represent phases in some units, and the y-axis may represent magnitudes in some units. The area 810 may represent a range of magnitudes and phases of nonlinearity that the adjustable nonlinearity generation circuitry 720 may generate. Each point in the area 810 may correspond to a particular voltage level of the variable gate voltage signal 710 and a specific logic high/low setting for each individual activation control signals 730. In other words, any point in the area 810 can be selected for nonlinearity generation by setting the variable gate voltage signal 710 to a respective voltage level and setting each individual activation control to a respective logic high or logic low.

Figure 9:
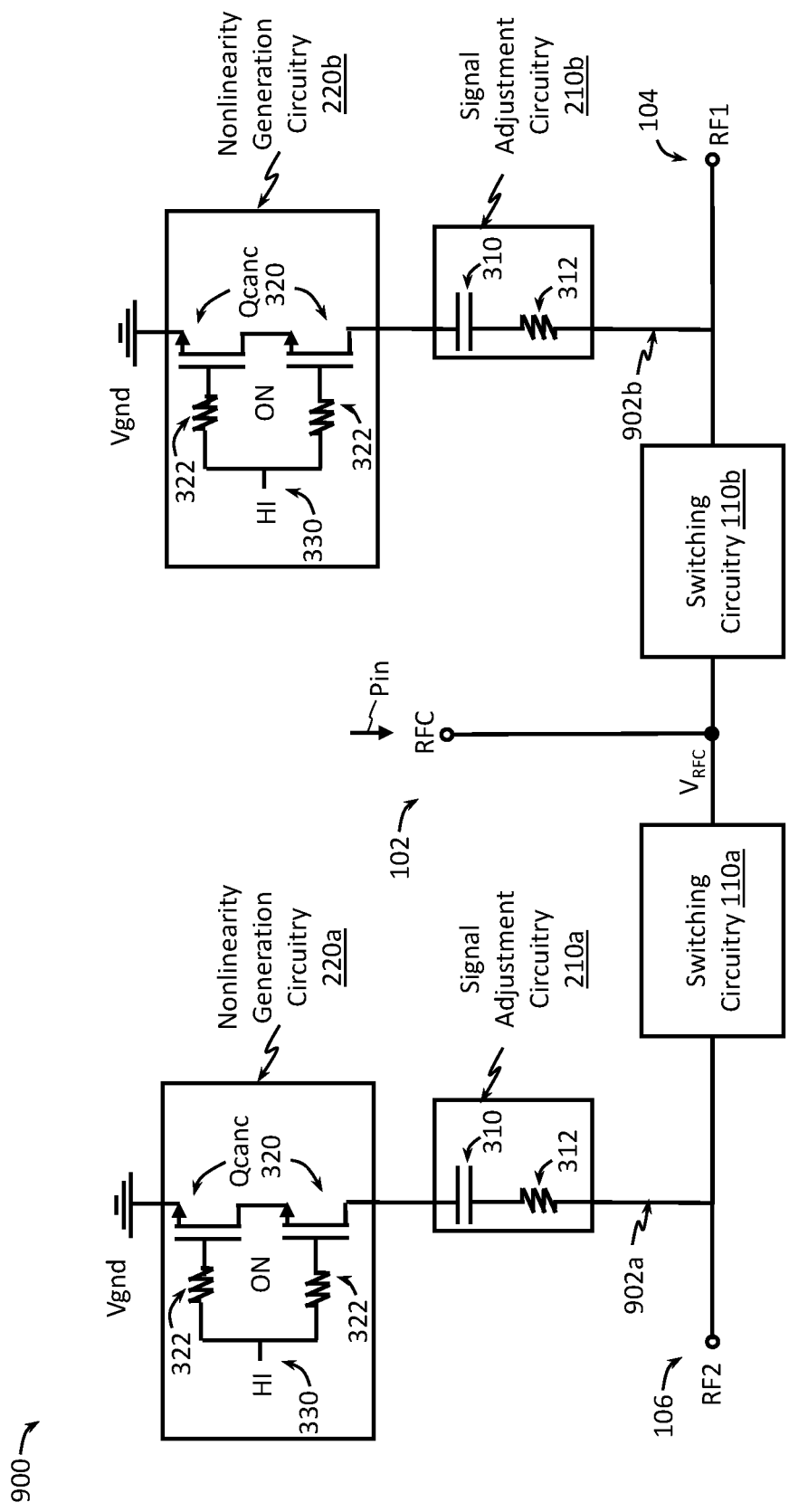
FIG. 9 is a schematic block diagram illustrating an exemplary high-linearity RF switch circuitry with built-in nonlinearity cancellation circuitry, according to some embodiments of the present disclosure.

A Variation of High-Linearity RF Switch Circuitry with Nonlinearity Cancellation Circuitry FIG. 9 is a schematic block diagram illustrating an exemplary high-linearity RF switch circuitry 900 with built-in nonlinearity cancellation circuitry, according to some embodiments of the present disclosure. Generally speaking, the RF switch circuitry 900 may be similar to the RF switch circuitry 300 in many respects. For example, the RF switch circuitry 900 shares the same circuitry including switching circuitries 110 (shown as 110*a* and 110*b*), signal adjustment circuitry 210 (shown as 210*a* and 210*b*), and nonlinearity generation circuitry 220 (shown as 220*a* and 220*b*) as the RF switch circuitry 300 of FIG. 3. For brevity's sake, a discussion of these circuitries is not repeated, and these circuitries may take the form of any embodiments disclosed herein. Further, in order not to clutter drawings provided in FIG. 9, details of the switching circuitries 110 are not shown.

As shown in FIG. 9, instead of having signal adjustment circuitry 210 and nonlinearity generation circuitry 220 coupled to the common port 102, the RF switch circuitry 900 includes a shunt path 902*a* having signal adjustment circuitry 210*a* and nonlinearity generation circuitry 220*a* coupled to the terminal port 106, and another shunt path 902*b* having signal adjustment circuitry 210*b* and nonlinearity generation circuitry 220*b* coupled to the terminal port 104.

In operation, the signal adjustment circuitry 210*a* and the nonlinearity generation circuitry 220*a* may generate a nonlinear cancellation (e.g., IMD3 cancellation signal) as described above with reference to FIGS. 2A-2C and 3 when an input signal Pin is switched or routed from the common port 102 to the terminal port 106. That is, the nonlinear cancellation signal may have a phase substantially opposite and a magnitude substantially the same as remaining nonlinear distortion of the RF switch circuitry 900 at the terminal 106. In a similar way, the signal adjustment circuitry 210*b* and the nonlinearity generation circuitry 220*b* may provide nonlinear cancellation (e.g., IMD3 cancellation) as described above with reference to FIGS. 2A-2C and 3 when an input signal Pin is switched or routed from the common port 102 to the terminal port 104.

While FIG. 9 illustrates the same signal adjustment circuitry and the same nonlinearity generation circuitry for the terminal port 106 and for the terminal port 104, different signal adjustment circuitry and/or different nonlinearity generation circuitry in terms of component values, sizes, and/or circuit arrangement can be used for the terminal port 106 and 104. One advantage of using different signal adjustment circuitry and/or different nonlinearity generation circuitry at different terminal ports is that the signal adjustment circuitry and/or nonlinearity generation circuitry can be configured or calibrated to suit the specific channel characteristics (e.g., based on the process) between the input port 102 and the corresponding terminal port. For example, in some instances, the RF switch circuitry 900 may include the signal adjustment circuitry 210*a* and the nonlinearity generation circuitry 220*a* for the terminal port 106, and may not include the signal adjustment circuitry 210*b* and the nonlinearity generation circuitry 220*b* for the terminal port 104, or vice versa.

Figure 10:
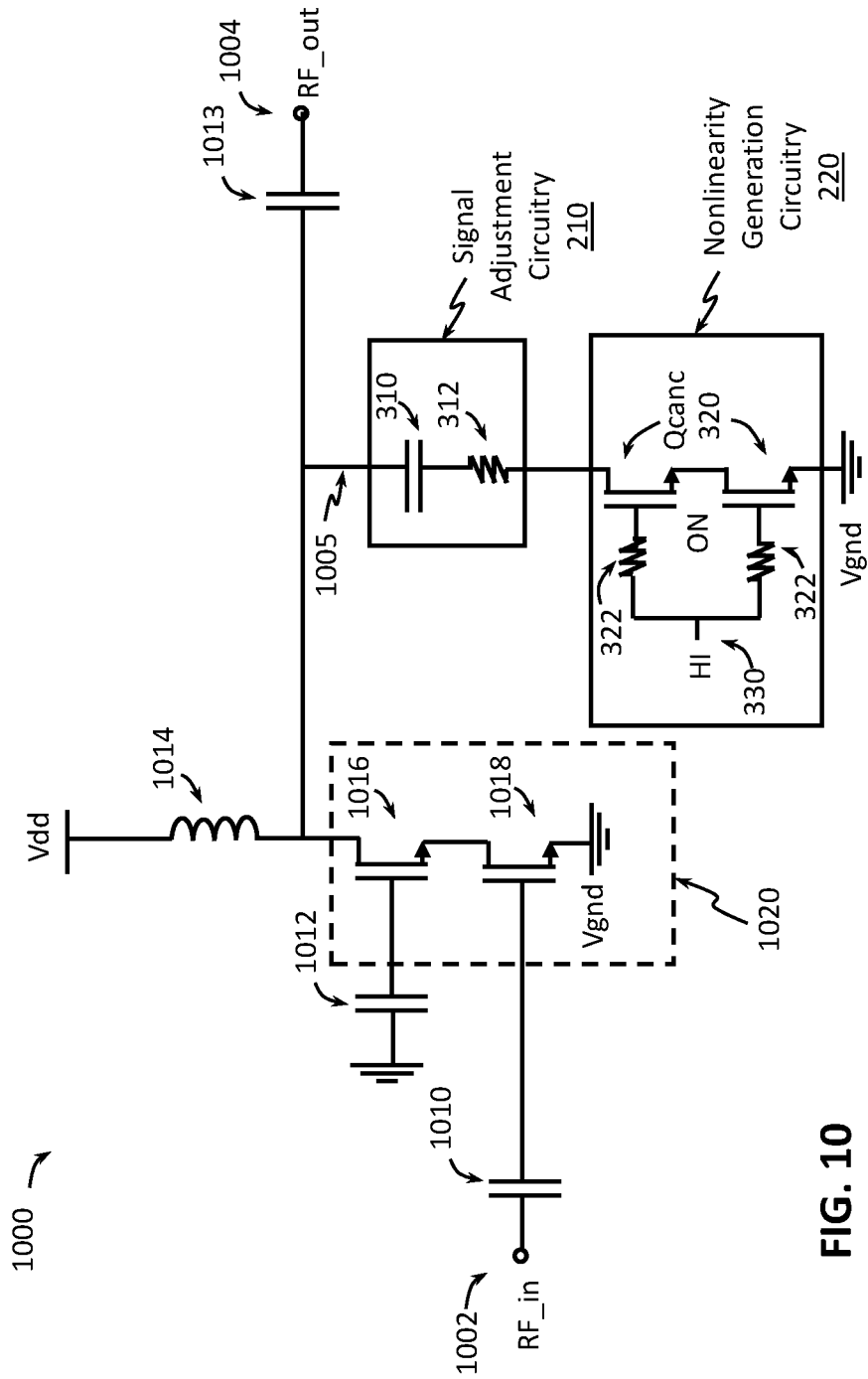
FIG. 10 is a schematic block diagram illustrating an exemplary high-linearity RF amplifier circuitry with built-in nonlinearity cancellation circuitry, according to some embodiments of the present disclosure.

Example of High-Linearity RF Amplifier Circuitry with Nonlinearity Cancellation Circuitry FIG. 10 is a schematic block diagram illustrating an exemplary high-linearity RF amplifier circuitry 1000 with built-in nonlinearity cancellation circuitry, according to some embodiments of the present disclosure. The RF amplifier circuitry 1000 may utilize similar nonlinear cancellation (e.g., IMD3 cancellation) techniques as discussed above with reference to FIGS. 2A-2C, 3, 4A-4C, 5-8. For example, the RF amplifier circuitry 1000 may share the same circuitry such as the signal adjustment circuitry 210 and the nonlinearity generation circuitry 220 as the RF switch circuitry 300 of FIG. 3. For brevity's sake, a discussion of these circuitries is not repeated, and these circuitries may take the form of any embodiments disclosed herein.

As shown in FIG. 10, the RF amplifier circuitry 1000 may include an input port 1002, represented by RF_in, an output port 1004, represented by RF_out, and amplifier circuitry 1020 (e.g., nonlinear circuitry) arranged on a signal path between the input port 1002 and the output port 1004. The amplifier circuitry 1020 may include MOS devices 1016 and 1018 connected in series. An input signal at the input port 1002 of the RF amplifier circuitry 1000 may be routed to a gate of the MOS device 1018, and may be amplified by the RF amplifier circuitry 1000. A corresponding amplified output RF signal is provided at a drain of the MOS device 1016, and routed to the output port 1004 of the RF amplifier circuitry 1000. The capacitors 1010, 1012, and 1013 can be used to decouple low frequency (e.g., DC) biasing voltages provided to the MOS devices 1018 and 1016 from the input signal and the amplified signal. A supply voltage, represented by Vdd, may be provided to the drain of the MOS device 1016 through an inductor 1014. A reference voltage (e.g., $V_{gnd}$) may be connected to a source of the input MOS device 1018.

The MOS devices 1016 and 1018 in the amplifier circuitry 1020 may have nonlinear characteristics, causing similar nonlinear distortion (e.g., IMD3) as discussed above with reference to FIGS. 2A-2C. The RF amplifier circuitry 1000 may provide nonlinearity cancellation by including a shunt path 1005 coupled to the output port 1004. The shunt path 1005 may include signal adjustment circuitry 210 and nonlinearity generation circuitry 220 connected in series between the output port 106 and a reference (e.g., $V_{gnd}$).

In some aspects, the RF amplifier circuitry 1000 can include an adjustable nonlinearity generation circuitry similar to the nonlinearity generation circuitry 520 of FIG. 5 or the adjustable nonlinearity generation circuitry 720 of FIG. 7 as discussed above with reference to FIGS. 5 and 7, respectively. In some aspects, the RF amplifier circuitry 1000 may be an integrated circuit device and calibration techniques as discussed above with reference to FIGS. 5 and 7 may be applied and calibration data may be used during runtime to control the adjustable nonlinearity generation circuitry. In general, the nonlinearity cancellation and associated calibration techniques can be applied to any types of RF amplifier devices (e.g., class A, B, AB, and C).

Example Methods for Providing High-Linearity RF Integrated Circuit Device

Figure 11:
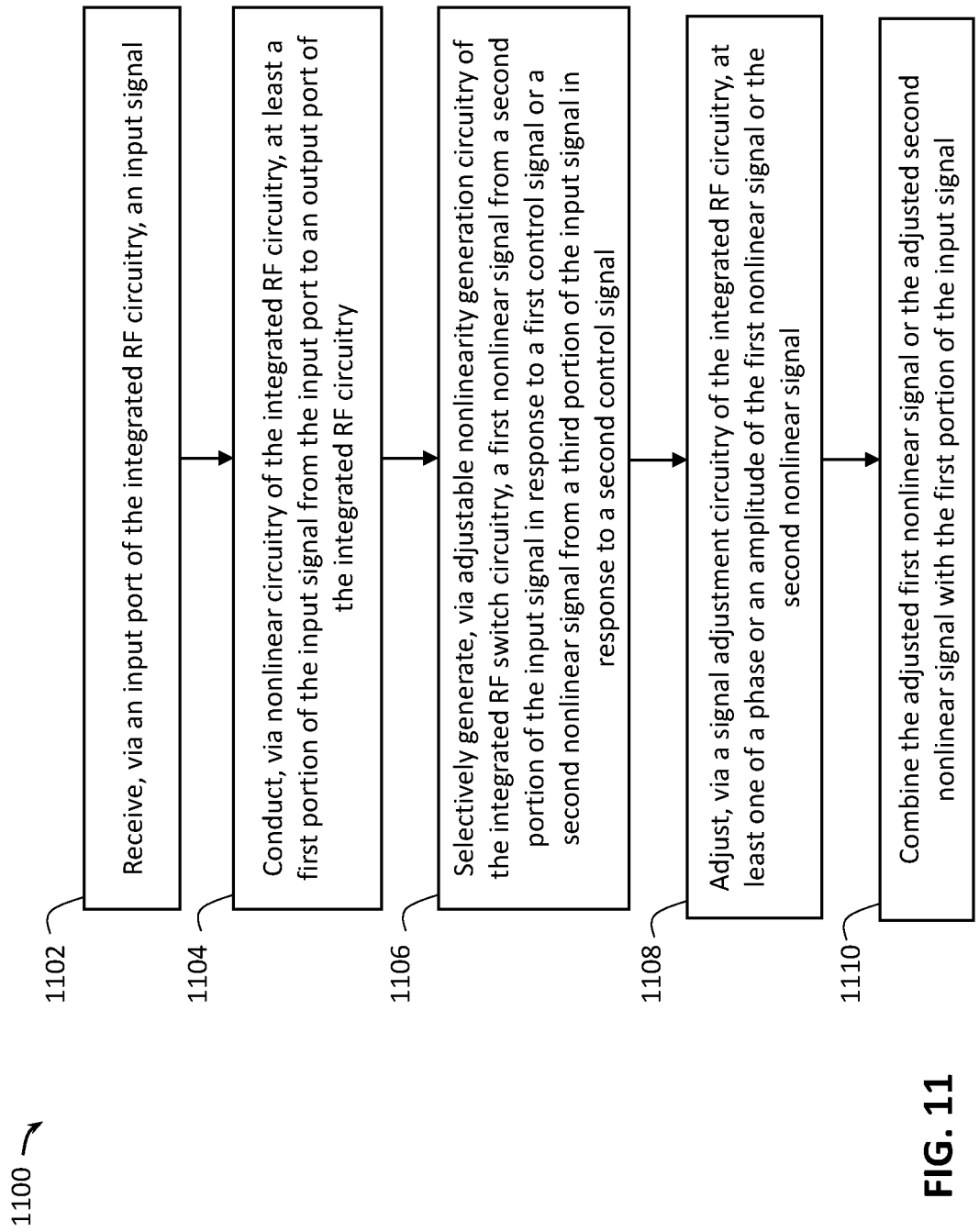
FIG. 11 is a flow diagram illustrating an exemplary method for operating high-linearity RF integrated circuit device, according to some embodiments of the present disclosure.

FIG. 11 is a flow diagram illustrating an exemplary method 1100 for operating high-linearity integrated RF switch circuitry, according to some embodiments of the present disclosure. The method 1100 can be implemented by the RF switch circuitry 300 of FIG. 3, RF switch circuitry 500 of FIG. 5, the RF switch circuitry 700 of FIG. 7, the RF switch circuitry 900 of FIG. 9, and/or the RF amplifier circuitry 1000 of FIG. 10. Although the operations of the method 1100 may be illustrated with reference to particular embodiments of the RF switch circuitry 300 of FIG. 3, the RF switch circuitry 500 of FIG. 5, the RF switch circuitry 700 of FIG. 7, the RF switch circuitry 900 of FIG. 9, and/or the RF amplifier circuitry 1000 of FIG. 10 disclosed herein, the method 1100 may be performed using any suitable hardware components and/or software components. Operations are illustrated once each and in a particular order in FIG. 11, but the operations may be performed in parallel, reordered, and/or repeated as desired.

At 1102, an input signal may be received at an input port of an RF integrated circuitry. At 1104, at least a first portion of the input signal may be conducted from the input port to an output port of the RF integrated circuitry via nonlinear circuitry (e.g., that operates on the input signal) of the RF integrated circuitry. In some aspects, the RF integrated circuitry may correspond to the RF switch circuitries 500, 700, or 900, the nonlinear circuitry may include the switching circuities 110, the input port may correspond to the common port 102, and the output port may correspond to the terminal port 104 or 106. In other aspects, the RF integrated circuitry may correspond to the RF amplifier circuitry 1000, the nonlinear circuitry may include the amplifier circuitry 1020, the input port may correspond to the input port 1002, and the output port may correspond to the output port 1004.

At 1106, a first nonlinear signal or a second nonlinear signal is selectively generated from a second portion of the input signal responsive to a first control signal or from a third portion of the input signal responsive to a second control signal, respectively, via adjustable nonlinearity generation circuitry (e.g., the adjustable nonlinearity generation circuitry 520 of FIG. 5 or the adjustable nonlinearity generation circuitry 720 of FIG. 7) of the RF integrated circuitry. The first control signal may have a first voltage level. The second control signal may have a second voltage level different from the first voltage level. The first nonlinear signal and the second nonlinear signal may have at least one of different amplitudes or different phases. In some aspects, the second portion may be substantially the same as the third portion. In some aspects, the second portion may be different than the third portion. In some aspects, the second portion and/or the third portion are substantially smaller than the first portion. For instance, the second portion or the third portion may have less than 5% of the total power of the input signal, and the first portion may be 95% or more of the total input signal power.

At 1108, at least one of an amplitude or a phase of the first nonlinear signal or the second nonlinear signal may be adjusted by signal adjustment circuitry (e.g., the signal adjustment circuitry 210) of the RF integrated circuitry.

At 1110, the adjusted first nonlinear signal or the adjusted second nonlinear signal is combined with the first portion of the input signal. In some aspects, the adjusted first nonlinear signal or the adjusted second nonlinear signal is in phase opposition to a nonlinear distortion (e.g., IMD3) of the RF integrated circuitry at the output port. Consequently, the combined signal may have a lower nonlinear distortion.

In some aspects, the selective generation of the first nonlinear signal or the second nonlinear signal at 1106 may include driving a gate terminal of at least one nonlinearity generation MOS device (e.g., the nonlinearity generation MOS devices 320 or 722) at the adjustable nonlinearity generation circuitry with the first control signal. Alternatively, the selective generation of the first nonlinear signal or the second nonlinear signal at 1106 may include driving the gate terminal of the nonlinearity generation MOS device with the second control signal. In some aspects, the first and second control signals may correspond to the variable gate control signal 510 or 710 set to different voltage levels.

In some aspects, one of the first voltage level or the second voltage level at 1106 corresponds to a logic high, and the other of the first voltage level or the second voltage level corresponds to a logic low. Further, the selectively generating the first nonlinear signal or the second nonlinear signal at 1106 may include applying the first control signal to a nonlinearity generation activation element (e.g., the activation MOS devices 726) at the adjustable nonlinearity generation circuitry to activate a nonlinearity generation MOS device (e.g., the nonlinearity generation MOS devices 320 and/or 722) at the adjustable nonlinearity generation circuitry. Alternatively, the selective generation of the first nonlinear signal or the second nonlinear signal at 1106 may include applying the second control signal to the nonlinearity generation activation element to deactivate the nonlinearity MOS device. For instance, the first control signal may correspond to the activation control signal 730 $V_{control,1}$, and the first control signal may correspond to the activation control signal 730 $V_{control,2}$.

In some aspects, the first voltage level of the first control signal is associated with a first temperature (e.g., current operating temperature), and the second voltage level of the second control signal is associated with a second temperature (e.g., current operating temperature) different from the first temperature. In other aspects, the first voltage level of the first control signal is associated with one of the input port or the output port, and the second voltage level of the second control signal is associated with another signal port (input or output port) of the RF integrated circuitry. In some embodiments, when the RF integrated circuitry is an RF switch circuitry, the first voltage level and the second voltage level may be associated with different terminal ports of the RF switch circuitry. For example, the first voltage level may be associated with a first terminal port (e.g., e.g., when the first terminal port is selected as the output port for the conducting at 1104), and the second voltage level may be associated with a second terminal port (e.g., when the second terminal port is selected as the output port for the conducting at 1104).

In some aspects, the method 1100 may further include monitoring a signal indicative of a nonlinear distortion (e.g., associated with a current operating temperature) in the integrated RF switch circuitry (e.g., via monitoring circuitry similar to the monitoring circuitry 550 or 750), and the selective generation of the first nonlinear signal or the second nonlinear signal at 1106 may be responsive to the monitoring. In some aspects, the method 1100 may further include generating the first control signal or the second control signal based on calibration data associated with the RF integrated circuitry. For example, RF integrated circuitry may be part of an integrated RF device, and the calibration data may be stored at a memory similar to the memory 540 and/or 740 at the integrated RF device.

FIG. 12 is a flow diagram illustrating an exemplary method 1200 for calibrating a high-linearity integrated RF switch device (e.g., the RF switch device 500 of FIG. 5 or the RF switch device 700 of FIG. 7), according to some embodiments of the present disclosure. The method 1200 can be implemented by a test bench for post-production calibration. The method 1200 may utilize similar calibration mechanisms as discussed above with reference to FIGS. 5 and 7. Operations are illustrated once each and in a particular order in FIG. 12, but the operations may be performed in parallel, reordered, and/or repeated as desired.

At 1202, a test signal is injected into a common port (e.g., the common port 102) of the integrated RF switch device e.g., the RF switch device 500 of FIG. 5 or the RF switch device 700 of FIG. 7). In some instances, the test signal may be generated by a signal generator.

At 1204, a gate voltage signal (e.g., the variable gate voltage signals 510 or 710) to the RF switch device is varied across a plurality of voltage levels, for example, using a variable voltage source similar to the variable gate voltages 512 and 712.

At 1206, nonlinear distortion measurements are measured at one or more terminal ports (e.g., the terminal ports 104 and 106) of the integrated RF switch device, where each nonlinear distortion measurement is associated with one voltage level of the plurality of voltage levels. For example, each nonlinear distortion measurement is measured (e.g., using a signal analyzer at each terminal port) when a different voltage level of the plurality of voltage levels is applied to the RF switch device.

At 1208, calibration data is generated to include an indication of a first voltage level of the plurality of voltage levels based on the first voltage level associated with a first nonlinear distortion measurement of the nonlinear distortion measurements being lower than a second nonlinear distortion measurement of the nonlinear distortion measurements.

In some aspects, the first nonlinear distortion measurement is associated with a first terminal port of the one or more terminal ports, and the generation of the calibration data at 1208 includes generating the calibration data to further include an association between the first voltage level and the first terminal port. In some aspects, the first nonlinear distortion measurement is associated with a temperature, and the generation of the calibration data at 1208 includes generating the calibration data to further include an association between the first voltage level and the temperature.

In some aspects, the method 1200 further includes storing the calibration data in a memory (e.g., the memory 540 or 740) of the integrated RF switch device.

In some aspects, the method 1200 may be performed on an RF amplifier integrated circuit device (e.g., the RF amplifier circuitry 1000 of FIG. 10). For instance, the test signal may be injected at an input port (e.g., the input port 1002) of the RF amplifier integrated circuit device and the nonlinear distortion measurement may be taken at an output port (e.g., the output port 1004) of the RF amplifier integrated circuit device.

FIG. 13 is a flow diagram illustrating an exemplary method 1300 for calibrating a high-linearity integrated RF switch device (e.g., the RF switch device 700 of FIG. 7), according to some embodiments of the present disclosure. The method 1300 can be implemented by test bench for post-production calibration. The method 1300 may utilize similar calibration mechanisms as discussed above with reference to FIG. 7. Operations are illustrated once each and in a particular order in FIG. 13, but the operations may be performed in parallel, reordered, and/or repeated as desired.

At 1302, a test signal is injected into a common port (e.g., the common port 102) of the integrated RF switch device (e.g., the RF switch device 700 of FIG. 7). In some instances, the test signal may be generated by a signal generator.

At 1304, a plurality of activation control signals (e.g., the activation control signals 730) to the RF switch device are varied across a plurality of activation/deactivation settings for a plurality of nonlinearity generation activation elements (e.g., the nonlinearity generation activation MOS devices 726) at the RF switch device. In some instances, each of the plurality of activation/deactivation settings may include a set of bits, each corresponding to one of the plurality of nonlinearity generation activation elements, where a bit-value of 1 may indicate setting the corresponding activation control signal to a logic high and a bit value of 0 may indicate setting corresponding activation control signal to a logic low, or vice versa.

At 1306, nonlinear distortion measurements are measured at one or more terminal ports of the integrated RF switch device, where each nonlinear distortion measurement is associated with a different activation/deactivation setting of the plurality of activation/deactivation settings. For example, each nonlinear distortion measurement is measured (e.g., using a signal analyzer at each terminal port) when the plurality of activation control signals are configured according to a different activation/deactivation setting of the plurality of activation/deactivation settings.

At 1308, calibration data is generated to include an indication of a first activation/deactivation setting of the plurality of activation/deactivation settings based on the activation/deactivation settings associated with a first nonlinear distortion measurement of the nonlinear distortion measurements being lower than a second nonlinear distortion measurement of the nonlinear distortion measurements.

In some aspects, the first nonlinear distortion measurement is associated with a first terminal port of the one or more terminal ports, and the generation of the calibration data at 1308 includes generating the calibration data to further include an association between the first activation/deactivation setting and the first terminal port. In some aspects, the first nonlinear distortion measurement is associated with a temperature, and the generation of the calibration data at 1108 includes generating the calibration data to further include an association between the first activation/deactivation setting and the temperature.

In some aspects, the method 1300 further includes storing the calibration data in a memory (e.g., the memory 540 or 740) of the integrated RF switch device.

In some aspects, the method 1300 may be performed on an RF amplifier integrated circuit device (e.g., the RF amplifier circuitry 1000 of FIG. 10). For instance, the test signal may be injected at an input port (e.g., the input port 1002) of the RF amplifier integrated circuit device and the nonlinear distortion measurement may be taken at an output port (e.g., the output port 1004) of the RF amplifier integrated circuit device.

In some aspects, post-production calibration for an integrated RF switch device such as the RF switch device 700 of FIG. 7 may include performing the method 1200 and the method 1300 discussed above with reference to FIG. 12 and FIG. 13, respectively.

EXAMPLES

Example 1 is a high-linearity radio frequency (RF) integrated circuit device, including an input port; an output port; nonlinear circuitry arranged on a signal path between the input port and the output port; a shunt path including signal adjustment circuitry; and adjustable nonlinearity generation circuitry coupled to the signal adjustment circuitry, the adjustable nonlinearity generation circuitry including one or more MOS devices; and at least one nonlinearity generation activation element connected in parallel with a source terminal and a drain terminal of a first MOS device of the one or more MOS devices and responsive to an activation control signal.

In Example 2, the high-linearity RF integrated circuit device of Example 1 can optionally include where the at least one nonlinearity generation activation element selectively activates or deactivates the first MOS device for nonlinearity generation based on the activation control signal.

In Example 3, the high-linearity RF integrated circuit device of any one of Examples 1-2 can optionally include where the nonlinearity generation activation element activates the first MOS device for the nonlinearity generation based on the activation control signal corresponding to a logic low.

In Example 4, the high-linearity RF integrated circuit device of any one of Examples 1-3 can optionally include where the nonlinearity generation activation element deactivates the first MOS device for the nonlinearity generation based on the activation control signal corresponding to a logic high.

In Example 5, the high-linearity RF integrated circuit device of any one of Examples 1-4 can optionally include where the at least one nonlinearity generation activation element includes a second MOS device, and a gate terminal of the second MOS device is driven by the activation control signal.

In Example 6, the high-linearity RF integrated circuit device of any one of Examples 1-5 can optionally include where a source terminal of the second MOS device is coupled to a source terminal of the first MOS device, and a drain terminal of the second MOS device is coupled to a drain terminal of the first MOS device.

In Example 7, the high-linearity RF integrated circuit device of any one of Examples 1-6 can optionally include where the first MOS device and the second MOS device have the same size.

In Example 8, the high-linearity RF integrated circuit device of any one of Examples 1-6 can optionally include where the first MOS device and the second MOS device have different sizes.

In Example 9, the high-linearity RF integrated circuit device of any one of Examples 1-8 can optionally include where the adjustable nonlinearity generation circuitry further includes a plurality of nonlinearity generation activation elements connected in series, and each nonlinearity generation activation element of the plurality of nonlinearity generation activation elements is connected in parallel with an associated one of the one or more MOS devices and responsive to an associated individual activation control signal.

In Example 10, the high-linearity RF integrated circuit device of any one of Examples 1-9 can optionally include where the shunt path including the signal adjustment circuitry and the adjustable nonlinearity generation circuitry is coupled to the input port.

In Example 11, the high-linearity RF integrated circuit device of any one of Examples 1-9 can optionally include where the shunt path including the signal adjustment circuitry and the adjustable nonlinearity generation circuitry is coupled to the output port.

In Example 12, the high-linearity RF integrated circuit device of any one of Examples 1-11 can optionally include where the high-linearity RF integrated circuit device is a RF switch device, and where the nonlinear circuitry arranged between the input port and the output port includes switching circuitry.

In Example 13, the high-linearity RF integrated circuit device of any one of Examples 1-11 can optionally include where the high-linearity RF integrated circuit device is a RF amplifier device, and where the nonlinear circuitry arranged between the input port and the output port includes amplifier circuitry.

In Example 14, the high-linearity RF integrated circuit device of any one of Examples 1-13 can optionally include further including memory to store calibration data, where the activation control signal is based on the calibration data.

In Example 15, the high-linearity RF integrated circuit device of Example 14 can optionally include where the calibration data includes first calibration data specific to the input port; and second calibration data specific to another input port.

In Example 16, the high-linearity RF integrated circuit device of Example 14 can optionally include where the calibration data includes first calibration data specific to a first temperature; and second calibration data specific to a second temperature different from the first temperature.

In Example 17, the high-linearity RF integrated circuit device of any one of Examples 1-16 can optionally include where the input port receives an input signal, the nonlinear circuitry conducts a first portion of the input signal to the at least one output port, and the first MOS device is modulated by a second portion of the input signal to generate a nonlinear signal.

In Example 18, the high-linearity RF integrated circuit device of Example 17 can optionally include where the signal adjustment circuitry adjusts at least one of an amplitude or a phase of the nonlinear signal.

In Example 19, the high-linearity RF integrated circuit device of Example 17 can optionally include where the adjusted nonlinear signal and a nonlinear distortion associated with the nonlinear circuitry are in phase opposition at the at least one output port.

In Example 20, the high-linearity RF integrated circuit device of Example 19 can optionally include where the nonlinear distortion is a third-order intermodulation distortion (IMD3) associated with the input signal.

In Example 21, the high-linearity RF integrated circuit device of any one of Examples 1-20 can optionally include where the one or more switching circuitries comprise a second MOS device having a larger size than the first MOS device in the adjustable nonlinearity generation circuitry.

In Example 22, the high-linearity RF integrated circuit device of any one of Examples 1-21 can optionally include where the one or more switching circuitries includes a second MOS device of the same MOS device type as the first MOS device in the adjustable nonlinearity generation circuitry.

In Example 23, the high-linearity RF integrated circuit device of any one of Examples 1-22 can optionally include further including a controller to control at least one of a gate voltage signal driving a gate terminal of the first MOS device or the activation control signal.

In Example 24, the high-linearity RF integrated circuit device of any one of Examples 1-23 can optionally include where the adjustable nonlinearity generation circuitry further includes a control input to receive at least one of a gate voltage signal for driving a gate terminal of the first MOS device or the activation control signal.

Example 25 is a method for operating an radio frequency (RF) integrated circuitry, the method including receiving, via an input port of the RF integrated circuitry, an input signal; conducting, via nonlinear circuitry of the RF integrated circuitry, at least a first portion of the input signal from the input port to an output port of the RF integrated circuitry; selectively generating, via adjustable nonlinearity generation circuitry of the RF integrated circuitry, a first nonlinear signal from a second portion of the input signal in response to a first control signal or a second nonlinear signal from a third portion of the input signal in response to a second control signal, where the first control signal has a first voltage level, and where the second control signal has a second voltage level different from the first voltage level; adjusting, via a signal adjustment circuitry of the RF integrated circuitry, at least one of a phase or an amplitude of the first nonlinear signal or the second nonlinear signal; and combining the adjusted first nonlinear signal or the adjusted second nonlinear signal with the first portion of the input signal.

In Example 26, the method of Example 25 can optionally include where the selectively generating the first nonlinear signal or the second nonlinear signal includes driving a gate terminal of at least one nonlinearity generation metal-oxide-semiconductor (MOS) device at the adjustable nonlinearity generation circuitry with the first control signal; or driving the gate terminal of the at least one nonlinearity generation MOS device with the second control signal.

In Example 27, the method of any one of Examples 25-26 can optionally include where one of the first voltage level or the second voltage level corresponds to a logic high, the other of the first voltage level or the second voltage level corresponds to a logic low, and the selectively generating the first nonlinear signal or the second nonlinear signal includes applying the first control signal to a nonlinearity generation activation element at the adjustable nonlinearity generation circuitry to activate a nonlinearity generation metal-oxide-semiconductor (MOS) device at the adjustable nonlinearity generation circuitry; or applying the second control signal to the nonlinearity generation activation element to deactivate the nonlinearity generation MOS device.

In Example 28, the method of any one of Examples 25-27 can optionally include where the nonlinear circuitry includes the switch circuitry; the first voltage level is associated with at least one of the input port or the output port; and the second control signal is associated with the other one the input port or the output port, another input port of the RF integrated circuitry, or another output port of the RF integrated circuitry.

In Example 29, the method of any one of Examples 25-27 can optionally include where the first voltage level is associated with a first temperature, and the second voltage level is associated with a second temperature different from the first temperature.

In Example 30, the method of any one of Examples 25-29 can optionally include monitoring a signal indicative of a nonlinear distortion in the RF integrated circuitry, where the selectively generating the first nonlinear signal or the second nonlinear signal is responsive to the monitoring.

Example 31 a high-linearity radio frequency (RF) integrated circuitry, including an input port to receive an input signal; an output port; nonlinear circuitry arranged along a signal path between the input port and the output port, the nonlinear circuitry producing a nonlinear distortion; and a shunt path including signal adjustment circuitry comprising a passive network; and nonlinearity generation circuitry comprising one or more metal-oxide-semiconductor (MOS) devices, where a source terminal or a drain terminal of a first MOS device of the one or more MOS devices is coupled to the passive network. The high-linearity RF switch circuitry can optionally include where the nonlinear circuitry along the signal path between the input port and the output port comprises at least one of switching circuitry or amplifier circuitry; and the shunt path comprising the signal adjustment circuitry and the nonlinearity generation circuitry is coupled to the input port or the output port.

In Example 32, the high-linearity RF switch circuitry of Example 31 can optionally include where the one or more MOS devices are modulated by a portion of the input signal to provide a nonlinear signal, and where the signal adjustment circuitry adjusts at least one of an amplitude or a phase of the nonlinear signal.

In Example 33, the high-linearity RF switch circuitry of any one of Examples 31-32 can optionally include where the nonlinear circuitry includes switching circuitries including a second MOS device having a larger size than a first MOS device of the one or more MOS devices in the nonlinearity generation circuitry In Example 33, the high-linearity RF integrated circuitry of any one of Examples 31-32 can optionally include where the one or more switching circuitries comprise a second MOS device having a larger size than a first MOS device of the one or more MOS devices in the nonlinearity generation circuitry.

In Example 34, the high-linearity RF integrated circuitry of any one of Examples 31-33 can optionally include where a gate terminal of a first MOS device of the one or more MOS devices is driven by an external variable voltage source.

In Example 35, the high-linearity RF integrated circuitry of any one of Examples 31-34 can optionally include where at least a first MOS device and a second MOS device of the one or more MOS devices in the nonlinearity generation circuitry are connected in series.

In Example 36, the high-linearity RF integrated circuitry of any one of Examples 31-35 can optionally include where the nonlinearity generation circuitry further includes a third MOS device connected in parallel with the first MOS device, where a gate terminal of the third MOS device is driven by a first control signal to activate or deactivate the first MOS device for first nonlinearity generation; and a fourth MOS device connected in parallel with the second MOS device can optionally include where a gate terminal of the fourth MOS device is driven by a second control signal to activate or deactivate the second MOS device for second nonlinearity generation.

Example 37 is a method for calibrating an integrated RF switch device, the method including injecting a test signal into a common port of the integrated RF switch device; varying a gate voltage signal to the RF switch device across a plurality of voltage levels; measuring nonlinear distortion measurements at one or more terminal ports at least one of a first terminal port or a second terminal port of the integrated RF switch device, where each nonlinear distortion measurement is associated with one voltage level of the plurality of voltage levels; and generating calibration data to include an indication of a first voltage level of the plurality of voltage levels based on the first voltage level associated with a first nonlinear distortion measurement of the nonlinear distortion measurements being lower than a second nonlinear distortion measurement of the nonlinear distortion measurements.

In Example 38, the method of Example 37 can optionally include where the first nonlinear distortion measurement is associated with a first terminal port of the one or more terminal ports, and the generating the calibration data further includes generating the calibration data to further include an association between the first voltage level and the first terminal port.

In Example 39, the method of any one of Examples 37-38 can optionally include where the first nonlinear distortion measurement is associated with a temperature, and the generating the calibration data further includes generating the calibration data to further include an association between the first voltage level and the temperature.

In Example 40, the method of any one of Examples 37-39 can optionally include storing the calibration data in a memory of the integrated RF switch device.

Example 41 is a method for calibrating an integrated RF switch device, the method including injecting a test signal into a common port of the integrated RF switch device; varying a plurality of activation control signals to the RF switch device across a plurality of activation/deactivation settings for a plurality of nonlinearity generation activation elements at the RF switch device; measuring nonlinear distortion measurements at one or more terminal ports of the integrated RF switch device, where each nonlinear distortion measurement is associated with one activation/deactivation setting of the plurality of activation/deactivation settings; and generating calibration data to include an indication of a first activation/deactivation setting of the plurality of activation/deactivation settings based on the activation/deactivation settings associated with a first nonlinear distortion measurement of the nonlinear distortion measurements being lower than a second nonlinear distortion measurement of the nonlinear distortion measurements.

In Example 42, the method of Example 41 can optionally include where the first nonlinear distortion measurement is associated with a first terminal port of the one or more terminal ports, and the generating the calibration data further includes generating the calibration data to further include an association between the first activation/deactivation setting and the first terminal port.

In Example 43, the method of any one of Examples 41-42 can optionally include where the first nonlinear distortion measurement is associated with a temperature, and the generating the calibration data further includes generating the calibration data to further include an association between the first activation/deactivation setting and the temperature.

Variations and Implementations

While embodiments of the present disclosure were described above with references to exemplary implementations as shown in FIGS. 1, 2A-2C, 3, 4A-4C, 5-13, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the embodiments above, components of a system, such as switching elements, nonlinearity generation devices/elements, nonlinearity generation activation elements, amplitude/phase adjustment elements, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to RF switches and RF amplifiers, in various communication systems.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the RF switch/amplifier circuitries shown in FIGS. 1, 2A, 3, 5, 7, 9, and 10) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Also, as used herein, the terms "substantially," "approximately," "about," etc., may be used to generally refer to being within +/−20% of a target value, e.g., within +/−10% of a target value, based on the context of a particular value as described herein or as known in the art.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

The invention claimed is:

1. A high-linearity radio frequency (RF) integrated circuit device, comprising:
   an input port;
   an output port;
   a memory to store calibration data;
   nonlinear circuitry arranged on a signal path between the input port and the output port; and
   a shunt path comprising:
      signal adjustment circuitry; and
      adjustable nonlinearity generation circuitry coupled to the signal adjustment circuitry, the adjustable nonlinearity generation circuitry comprising:
         one or more metal-oxide-semiconductor (MOS) devices; and
         at least one nonlinearity generation activation element connected in parallel with a source terminal and a drain terminal of a first MOS device of the one or more MOS devices and responsive to an activation control signal, the activation control signal based on the calibration data.

2. The high-linearity RF integrated circuit device of claim 1, wherein the at least one nonlinearity generation activation element selectively activates or deactivates the first MOS device for nonlinearity generation based on the activation control signal.

3. The high-linearity RF integrated circuit device of claim 1, wherein:
   the at least one nonlinearity generation activation element comprises a second MOS device, and
   a gate terminal of the second MOS device is driven by the activation control signal.

4. The high-linearity RF integrated circuit device of claim 1, wherein the shunt path comprising the signal adjustment circuitry and the adjustable nonlinearity generation circuitry is coupled to the input port.

5. The high-linearity RF integrated circuit device of claim 1, wherein the shunt path comprising the signal adjustment circuitry and the adjustable nonlinearity generation circuitry is coupled to the output port.

6. The high-linearity RF integrated circuit device of claim 1, wherein the nonlinear circuitry arranged on the signal path between the input port and the output port comprises switching circuitry.

7. The high-linearity RF integrated circuit device of claim 1, wherein the nonlinear circuitry arranged on the signal path between the input port and the output port comprises amplifier circuitry.

8. The high-linearity RF integrated circuit device of claim 1, wherein:
   the input port receives an input signal,
   the nonlinear circuitry conducts a first portion of the input signal to the output port, and the first MOS device is modulated by a second portion of the input signal to generate a nonlinear signal.

9. The high-linearity RF integrated circuit device of claim 8, wherein the signal adjustment circuitry adjusts at least one of an amplitude or a phase of the nonlinear signal.

10. The high-linearity RF integrated circuit device of claim 1, further comprising:
a controller to control at least one of the activation control signal or a gate voltage signal driving a gate terminal of the first MOS device.

11. The high-linearity RF integrated circuit device of claim 1, wherein the adjustable nonlinearity generation circuitry further comprises:
a control input to receive at least one of the activation control signal or a gate voltage signal for driving a gate terminal of the first MOS device.

12. The high-linearity radio frequency (RF) integrated circuit device of claim 1, wherein the calibration data corresponds to a specified temperature; and
wherein the at least one nonlinearity generation activation element is responsive to an activation control signal based on the calibration data and based on a monitored temperature.

13. A method for operating a radio frequency (RF) integrated circuitry, the method comprising:
receiving, via an input port of the RF integrated circuitry, an input signal;
conducting, via nonlinear circuitry of the RF integrated circuitry, at least a first portion of the input signal from the input port to an output port of the RF integrated circuitry;
monitoring a signal indicative of a nonlinear distortion in the RF integrated circuitry;
selectively generating, via adjustable nonlinearity generation circuitry of the RF integrated circuitry, a first nonlinear signal from a second portion of the input signal in response to a first control signal or a second nonlinear signal from a third portion of the input signal in response to a second control signal, wherein the first control signal has a first voltage level, and wherein the second control signal has a second voltage level different from the first voltage level;
adjusting, via a signal adjustment circuitry of the RF integrated circuitry, at least one of a phase or an amplitude of the first nonlinear signal or the second nonlinear signal;
combining the adjusted first nonlinear signal or the adjusted second nonlinear signal with the first portion of the input signal; and
wherein the selectively generating the first nonlinear signal or the second nonlinear signal is responsive to the monitoring.

14. The method of claim 13, wherein the selectively generating the first nonlinear signal or the second nonlinear signal comprises:
driving a gate terminal of at least one nonlinearity generation metal-oxide-semiconductor (MOS) device of the adjustable nonlinearity generation circuitry with the first control signal; or
driving the gate terminal of the at least one nonlinearity generation MOS device with the second control signal.

15. The method of claim 13, wherein:
one of the first voltage level or the second voltage level corresponds to a logic high,
the other one of the first voltage level or the second voltage level corresponds to a logic low, and
the selectively generating the first nonlinear signal or the second nonlinear signal comprises:
applying the first control signal to a nonlinearity generation activation element of the adjustable nonlinearity generation circuitry to activate a nonlinearity generation metal-oxide-semiconductor (MOS) device at the adjustable nonlinearity generation circuitry; or
applying the second control signal to the nonlinearity generation activation element to deactivate the nonlinearity generation MOS device.

16. A high-linearity radio frequency (RF) integrated circuitry, comprising:
an input port to receive an input signal;
an output port;
nonlinear circuitry arranged along a signal path between the input port and the output port, the nonlinear circuitry producing a nonlinear distortion; and
a shunt path comprising:
signal adjustment circuitry comprising a passive network; and
nonlinearity generation circuitry comprising one or more metal-oxide-semiconductor (MOS) devices, wherein a source terminal or a drain terminal of a first MOS device of the one or more MOS devices is coupled to the passive network, the nonlinearity generation circuitry controlled based on calibration data stored in a memory.

17. The high-linearity RF integrated circuitry of claim 16, wherein the one or more MOS devices are modulated by a portion of the input signal to provide a nonlinear signal, and wherein the signal adjustment circuitry adjusts at least one of an amplitude or a phase of the nonlinear signal.

18. The high-linearity RF integrated circuitry of claim 16, wherein:
the nonlinear circuitry along the signal path between the input port and the output port comprises at least one of switching circuitry or amplifier circuitry; and
the shunt path comprising the signal adjustment circuitry and the nonlinearity generation circuitry is coupled to the input port or the output port.

19. The high-linearity RF integrated circuitry of claim 16, wherein a gate terminal of the first MOS device of the one or more MOS devices is driven by an external variable voltage source.

20. The high-linearity radio frequency (RF) integrated circuitry of claim 16, wherein the calibration data corresponds to a specified temperature; and
wherein the nonlinearity generation circuitry is controlled based on the calibration data and based on a monitored temperature.

* * * * *